(12) United States Patent
Kono et al.

(10) Patent No.: US 9,048,619 B2
(45) Date of Patent: Jun. 2, 2015

(54) LASER DIODE ASSEMBLY

(71) Applicants: Sony Corporation, Tokyo (JP); Tohoku University, Miyagi (JP)

(72) Inventors: Shunsuke Kono, Miyagi (JP); Hiroyuki Yokoyama, Miyagi (JP); Masaru Kuramoto, Kanagawa (JP); Tomoyuki Oki, Kanagawa (JP)

(73) Assignees: Sony Corporation, Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 14/186,679

(22) Filed: Feb. 21, 2014

(65) Prior Publication Data

US 2014/0169391 A1    Jun. 19, 2014

Related U.S. Application Data

(62) Division of application No. 13/267,509, filed on Oct. 6, 2011.

(30) Foreign Application Priority Data

Oct. 22, 2010    (JP) .................................. 2010-237094

(51) Int. Cl.
*H01S 5/065* (2006.01)
*B82Y 20/00* (2011.01)
*H01S 5/14* (2006.01)
(Continued)

(52) U.S. Cl.
CPC .............. *H01S 5/0657* (2013.01); *B82Y 20/00* (2013.01); *H01S 5/0287* (2013.01); *H01S 5/141* (2013.01); *H01S 5/3063* (2013.01); *H01S 5/3202* (2013.01); *H01S 5/3216* (2013.01); *H01S 5/34333* (2013.01)

(58) Field of Classification Search
CPC ....... B82Y 20/00; H01S 5/0657; H01S 5/141; H01S 5/3202; H01S 5/3216
USPC .............................. 359/340; 372/18, 102, 20
See application file for complete search history.

(56) References Cited

U.S. PATENT DOCUMENTS 6,091,755 A * 7/2000 Sanders et al. .................. 372/92
6,594,289 B2   7/2003 Yamada et al.
(Continued)

FOREIGN PATENT DOCUMENTS

| JP | 03-195076 | 8/1991 |
|---|---|---|
| JP | 08-181390 | 7/1996 |

(Continued)

OTHER PUBLICATIONS

Extended European Search Report dated Feb. 20, 2014 in corresponding European Patent Application No. 11008275.7.
(Continued)

*Primary Examiner* — Tuan Nguyen
(74) *Attorney, Agent, or Firm* — K&L Gates LLP

(57) ABSTRACT

A laser diode assembly includes: a mode-locked laser diode device; a diffraction grating that configures an external resonator, returns primary or more order diffracted light to the mode-locked laser diode device, and outputs 0-order diffracted light outside; and an imaging section provided between the mode-locked laser diode device and the diffraction grating and imaging an image of a light output end face of the mode-locked laser diode device on the diffraction grating.

3 Claims, 13 Drawing Sheets

(51) Int. Cl.
  *H01S 5/028* (2006.01)
  *H01S 5/30* (2006.01)
  *H01S 5/32* (2006.01)
  *H01S 5/343* (2006.01)

(56) References Cited

U.S. PATENT DOCUMENTS

| | | | |
|---|---|---|---|
| 6,698,941 B2 | 3/2004 | Yokoyama | |
| 7,960,092 B2 | 6/2011 | Yamatsu et al. | |
| 2001/0026574 A1 | 10/2001 | Yagi | |
| 2002/0064353 A1 | 5/2002 | Tokoyama | |
| 2005/0063435 A1* | 3/2005 | Imai et al. | 372/43 |
| 2006/0140228 A1* | 6/2006 | McDonald et al. | 372/20 |
| 2006/0193354 A1 | 8/2006 | Rosenblatt | |
| 2009/0185586 A1* | 7/2009 | Jhung et al. | 372/20 |
| 2010/0246622 A1 | 9/2010 | Watanabe et al. | |

FOREIGN PATENT DOCUMENTS

| | | |
|---|---|---|
| JP | 2001-284716 | 10/2001 |
| JP | 2002-164614 | 6/2002 |
| JP | 2006-210826 | 8/2006 |
| JP | 2006-270106 | 10/2006 |
| JP | 2008-514029 | 5/2008 |

OTHER PUBLICATIONS

Pan, "Tunable Picosecond Pulse Generation from an Actively Mode-Locked Laser Diode Array with Intracavity Chirp Compensation", Institute of Electro-optical Engineering, Nat. Chiao Tung Univ.

Schlauch, "High peak power femtosecond pulses from modelocked semiconductor laser in external cavity", Electronics Letters, May 22, 2008, vol. 44, No. 11.

Delfyette, "Intracavity Spectral Shaping in External Cavity Mode-Locked Semiconductor Diode Lasers", IEEE J. of Selected Topics in Quantum Electronics, 1998, vol. 4, No. 2.

Archundia, "External cavity multiwavelength semiconductor hybrid mode-locked laser intracavity gain dynamics", Applied Physics Letters 88, 191117, 2006.

Koda, "100 W peak-power 1 GHz repetition picoseconds optical pulse generation using blue-violet galnN diode laser mode-locked oscillator and optical amplifier", Applied Physics Letters 97, 012101 (2010).

Japanese Office Action issued Mar. 4, 2014 in corresponding Japanese Patent Application No. 2010237094.

Heim, "Single-angled-facet laser diode for widely tunable external cavity semiconductor lasers with high spectral purity", Electronics Letters, Jul. 31, 1997, vol. 33, No. 16.

Struckmeier, "Electronically tunable external-cavity laser diode", Optics Letters, Nov. 15, 1999, Vo. 24, No. 22.

"Single-angled-facet laser diode for widely tunable external cavity semiconductor lasers with high spectral purity" Electronics Letters vol. 33 No. 16 pp. 1387-1389, Jul. 31, 1997.

"Electronically tunable external-cavity laser diode" Optics Letters vol. 24 No. 22 pp. 1573-1574, Nov. 15, 1999.

Japanese Office Action issued Mar. 25, 2015 in corresponding Japanese Application No. 2014094519.

\* cited by examiner

LASER DIODE ASSEMBLY

PRIORITY CLAIM

The present application is a divisional application of U.S. patent application Ser. No. 13/267,509 filed Oct. 6, 2011, which application claims priority to that disclosed in Japanese Priority Patent Application JP 2010-237094 filed in the Japanese Patent Office on Oct. 22, 2010, the entire contents of which is hereby incorporated by reference.

BACKGROUND

The present disclosure relates to a laser diode assembly.

Recently, in the advanced scientific region researches using laser light with the pulse time on the attosecond time scale or on the femtosecond time scale, the ultrashort pulse and ultrahigh power laser is actively used. The ultrashort pulse laser commands scientific interest to clarify ultrafast phenomenon on the picosecond time scale or femtosecond time scale. In addition, regarding the ultrashort pulse laser, application researches on practical realization such as microfabrication and two-photon imaging by using high peak power have been actively made. Further, the high power and ultrashort pulse laser diode device that is composed of GaN compound semiconductor and that has light emitting wavelength of 405 nm band has been expected to be a light source for a volumetric optical disc system promising as a next generation optical disc system displacing the Blu-ray optical disc system, has been expected to be a light source needed in the medical field, the bio imaging field, and the like, or has been expected to be a coherent light source that covers a whole visible light region.

As the ultrashort pulse and ultrahigh power laser, for example, titanium/sapphire laser is known. Such titanium/sapphire laser is an expensive and large solid laser light source, which is a main factor to inhibit spread of the technology. If the ultrashort pulse and ultrahigh power laser is realized with the use of a laser diode or a laser diode device, substantial miniaturization, price reduction, low power consumption, and high stability are able to be realized, which is expected to become a breakthrough for promoting its wide usage in these fields.

A laser diode assembly having a whole semiconductor structure as the foregoing high peak power and picosecond pulse light source in 405 nm band generally has a MOPA (Master Oscillator and Power Amplifier) structure. Specifically, the laser diode assembly is composed of a laser diode that generates a picosecond pulse and a semiconductor optical amplifier (SOA, or a semiconductor laser amplifier) that amplifies the generated picosecond pulse (semiconductor optical amplifier (SOA)). Specific examples of pulse light source that generates a picosecond pulse in the MOPA structure include a mode-locked laser diode assembly having an external resonator.

The mode-locked laser diode assembly is realized by, for example, a multielectrode mode-locked laser diode device and an external resonator arranged on its light axis. One end face of the multielectrode mode-locked laser diode device often includes a high reflecting coating layer, and also functions as a mirror opposed to the external resonator. By arranging a wavelength selection device such as a diffraction grating and a bandpass filter composed of a dielectric multilayer film, oscillation wavelength is able to be selected.

In the case where the diffraction grating is used as the wavelength selection device, the external resonator is composed of the diffraction grating, primary diffracted light is returned to the laser diode device, and thereby oscillation wavelength is able to be selected. Such arrangement is known as Littrow configuration or Littman configuration, and is used for a continuous oscillation wavelength-variable laser (for reference, see Japanese Unexamined Patent Application Publication No. 2001-284716; "Electronics letters," vol. 33, No. 16, p. 1387, 1997, Heim et al; and "Optics letters," vol. 24, No. 22, p. 1573, 1999, Struckmeier et al). Meanwhile, in the case where the bandpass filter is used as the wavelength selection device, the bandpass filter is arranged between the laser diode device and the external resonator, and thereby wavelength selectivity is obtained (for example, see Japanese Unexamined Patent Application Publication No. 2002-164614).

SUMMARY

In the Littrow configuration, for the purpose of increasing wavelength resolution, light entering the diffraction grating is collimated parallel beam. Thus, in the case where the Littrow configuration is used for the mode-locked laser diode assembly having the external resonator, a shift of the parallel beam resulting from mechanical vibration of the external resonator or the like causes a shift of an imaging point fed back onto the laser diode device. Accordingly mode locking operation becomes unstable.

Meanwhile, in the case where the bandpass filter is arranged, an image of a light output end face of the laser diode device is imaged on the external resonator composed of a partial transmission mirror as an output coupler, and thereby stability of the external resonator is able to be improved. Thus, instability of the mode-locking operation is able to be inhibited. However, in the mode-locked laser diode device, in general, wavelength is changed during pulse duration in pulse operation. Such phenomenon is called chirping. In addition, it has been found that regarding picosecond light pulse, the bandpass filter shows transmission characteristics different from that for fixed light, and gives unexpected light loss. That is, it has been found that laser light that is reflected by the bandpass filter and is returned to the mode-locked laser diode device is increased. The chirping amount varies according to drive conditions (injection current and reverse bias voltage) of the mode-locked laser diode device. Thus, it is not easy to predict the chirping about and design a bandpass filter. Therefore, though the mode-locked laser diode assembly having the external resonator using the bandpass filter has a simple structure, the mode-locked laser diode assembly having the external resonator using the bandpass filter is not suitable for obtaining large output.

Accordingly, it is desirable to provide a laser diode assembly that is able to inhibit generation of a disadvantage that mode locking operation becomes unstable and that is able to provide large output.

According to a first embodiment for attaining the foregoing object, there is provided a laser diode assembly comprising: a mode-locked laser diode device, a diffraction grating that configures an external resonator, returns primary or more order diffracted light to the mode-locked laser diode device, and outputs 0-order diffracted light outside, and an imaging section provided between the mode-locked laser diode device and the diffraction grating and imaging an image of a light output end face of the mode-locked laser diode device on the diffraction grating.

According to a second embodiment for attaining the foregoing object, there is provided a laser diode assembly comprising: a mode-locked laser diode device; a diffraction grating that outputs 0-order diffracted light outside; an external resonator composed of a reflecting mirror that reflects primary or more order diffracted light from the diffraction grating and returns the reflected light to the mode-locked laser diode device thorough the diffraction grating; and an imaging section provided between the mode-locked laser diode device and the diffraction grating and imaging laser light outputted from the mode-locked laser diode device on the external resonator.

According to a third embodiment for attaining the foregoing object, there is provided a laser diode assembly comprising: a mode-locked laser diode device; an external resonator; a bandpass filter arranged between the mode-locked laser diode device and the external resonator and having a film thickness continuously changed; and a moving unit that moves the bandpass filter. A part of laser light running into the bandpass filter is outputted outside, and the rest of the laser light running into the bandpass filter passes through the bandpass filter, enters the external resonator, is reflected by the external resonator, passes through the bandpass filter, and is returned to the mode-locked laser diode device.

In the laser diode assembly according to the first embodiment, the imaging section imaging the image of the light output end face of the mode-locked laser diode device on the diffraction grating is included between the mode-locked laser diode device and the diffraction grating. That is, laser light that is outputted from the light output end face of the mode-locked laser diode device and enters (runs into) the diffraction grating is not parallel light beam. Further, in the laser diode assembly according to the second embodiment, the imaging section imaging laser light outputted from the mode-locked laser diode device on the external resonator is included between the mode-locked laser diode device and the diffraction grating. That is, laser light that is outputted from the light output end face of the mode-locked laser diode device and enters (runs into) the diffraction grating is not parallel light beam. Thus, even if mechanical vibration or the like is given to the external resonator, location of the output end face and its image formation is not changed as long as focused light beam is not shifted from the aperture of the imaging lens. Therefore, mode locking operation is able to be inhibited from being unstable.

In the laser diode assembly according to the third embodiment, the bandpass filter arranged between the mode-locked laser diode device and the external resonator (output coupler, for example, a partial transmissive mirror) having a film thickness continuously changed and a moving unit that moves the bandpass filter are included. Thus, even if chirping amount is changed depending on drive conditions (for example, injection current and reverse bias voltage) of the mode-locked laser diode device and accordingly unexpected loss is given to the laser diode assembly, such loss is extracted from the laser diode assembly as reflection, which is able to be effectively used as laser output, and thereby large output is able to be obtained.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1A:
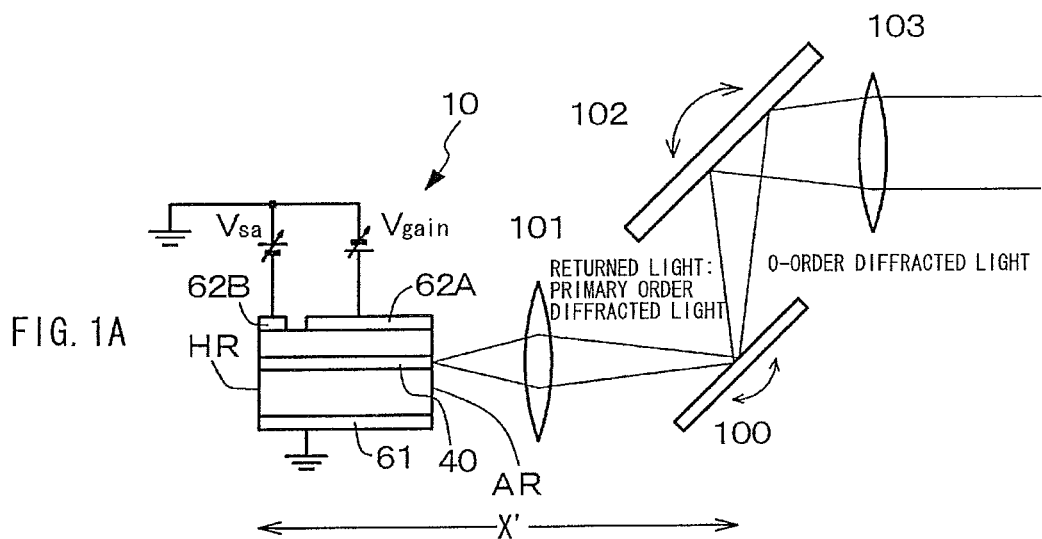
FIG. 1A is a conceptual view of a laser diode assembly of a first exemplified embodiment.

While the present disclosure will be hereinafter described based on embodiments with reference to the drawings, the present disclosure is not limited to the embodiments, and various numerical values and materials in the embodiments are exemplification. The description will be given in the following order:

1. Explanation of laser diode equipment assemblies according to a first embodiment to a third embodiment, and overall description 2. First exemplified embodiment (the laser diode assembly according to the first embodiment)

3. Second exemplified embodiment (the laser diode assembly according to the second embodiment)

4. Third exemplified embodiment (the laser diode assembly according to the third embodiment)

5. Fourth exemplified embodiment (modification of the mode-locked laser diode device) and others Explanation of Laser Diode Equipment Assemblies According to a First Embodiment to a Third Embodiment, and Overall Description In the laser diode assembly according to the first embodiment, a turning unit for turning a diffraction grating is preferably further included, and wavelength of laser light to be returned to a mode-locked laser diode device is preferably controlled by turning the diffraction grating caused by operation of the turning unit. Specific examples of the turning unit may include a piezoelectric device, a combination of a motor and a gear, and a yoke coil. In this case, a reflecting mirror for reflecting 0-order diffracted light outputted from the diffraction grating is preferably further included, and a correction mechanism for correcting a shift of a light path of the 0-order diffracted light reflected by the reflecting mirror resulting from the turning of the diffraction grating caused by operation of the turning unit is preferably further included. Specific examples of the correction mechanism may include a piezoelectric device, a combination of a motor and a gear, and a yoke coil.

In the laser diode assembly according to the first embodiment including the preferred forms and the preferred structures described above, where the length in the lateral direction of laser light on the light output end face of the mode-locked laser diode device is $L_1$ and the length in the lateral direction of an image on the light output end face of the mode-locked laser diode device that is imaged on the diffraction grating is $L_2$, $1*10 \leq L_2/L_1 \leq 1*10^2$ is preferably satisfied, and $20 \leq L_2/L_1 \leq 50$ is desirably satisfied. Further, as the number of lattice-shaped patterns in the diffraction grating included in laser light entering (running into) the diffraction grating, from 1200 to 3600 both inclusive, or desirably from 2400 to 3600 both inclusive may be exemplified.

In the laser diode assembly according to the second embodiment, the reflecting mirror composing the external resonator may be formed with a concave mirror. In this case, the curvature radius of the concave mirror is desirably equal to the distance from the diffraction grating to the concave mirror. That is, the center of curvature of the concave mirror is desirably included in a region of the diffraction grating which laser light outputted from the mode-locked laser diode device enters (runs into). Otherwise, the reflecting mirror composing the external resonator may be a flat mirror with a turning mechanism. Further, in the laser diode assembly according to the second embodiment including the preferred forms and the preferred structures, a plurality of apertures for regulating entrance of laser light into the external resonator may be arranged between the diffraction grating and the external resonator, and the apertures may be formed with a transmissive liquid crystal display unit having many segments. In addition, wavelength of laser light to be returned to the mode-locked laser diode device may be controlled by selecting an aperture.

In the laser diode assembly according to the first embodiment or the second embodiment including the preferred forms and the preferred structures described above, an imaging section may be composed of a lens. However, the imaging section is not limited thereto, and for example, a concave mirror or a combination of a concave mirror and a lens may be used.

In the laser diode assembly according to the third embodiment, wavelength of laser light passing through the bandpass filter may be determined depending on location where the laser light passes through the bandpass filter. In the laser diode assembly according to the third embodiment including the foregoing form, the external resonator may be composed of a partial transmission mirror (a half transmission mirror or a half mirror). Further, in the laser diode assembly according to the third embodiment including the foregoing forms, an imaging section imaging an image of the light output end face of the mode-locked laser diode device on the external resonator may be included between the mode-locked laser diode device and the external resonator. Examples of the imaging section may include a lens, a concave mirror, and a combination of a concave mirror and a lens.

In the laser diode assembly according to the first embodiment, the second embodiment, or the third embodiment including the preferred forms and the preferred structures described above (in some cases, hereinafter collectively referred to as "the laser diode assembly according to the embodiments" simply), the mode-locked laser diode device may be composed of a bisection type laser diode device. The bisection type laser diode device may include (a) a laminated structure in which a first compound semiconductor layer that has a first conductivity type and is composed of GaN compound semiconductor, a third compound semiconductor layer (active layer) that has a light emitting region and a saturable absorption region composed of GaN compound semiconductor, and a second compound semiconductor layer that has a second conductivity type different from the first conductivity type and is composed of GaN compound semiconductor are sequentially layered, (b) a strip-shaped second electrode formed on the second compound semiconductor layer, and (c) a first electrode electrically connected with the first compound semiconductor layer. The second electrode may be separated into a first section for obtaining forward bias state by applying a direct current to the first electrode through the light emitting region and a second section for adding electric field to the saturable absorption region by a separation trench.

An electric resistance value between the first section and the second section of the second electrode is $1*10$ times or more as much as an electric resistance value between the second electrode and the first electrode, is preferably $1*10^2$ or more as much as an electric resistance value between the second electrode and the first electrode, and is more preferably $1*10^3$ or more as much as an electric resistance value between the second electrode and the first electrode. It is to be noted that such a mode-locked laser diode device is referred to as "a first-structure mode-locked laser diode device" for convenience. Further, the electric resistance value between the first section and the second section of the second electrode is $1*10^2 \Omega$ or more, is preferably $1*10^3 \Omega$ or more, and is more preferably $1*10^4 \Omega$ or more. It is to be noted that such a mode-locked laser diode device is referred to as "a second structure mode-locked laser diode device" for convenience.

In the first structure mode-locked laser diode device or the second structure mode-locked laser diode device, the forward bias state is obtained by flowing a DC current from the first section of the second electrode to the first electrode through the light emitting region, and electric field is added to the saturable absorption region by applying a voltage between the first electrode and the second section of the second electrode, and thereby mode locking operation is enabled.

In the first structure mode-locked laser diode device or the second structure mode-locked laser diode device as described above, the electric resistance value between the first section and the second section of the second electrode is 10 times or more as much as the electric resistance value between the second electrode and the first electrode, or is $1*10^2 \Omega$ or more. Thus, leakage current flow from the first section to the second section of the second electrode may be securely inhibited. That is, reverse bias voltage $V_{sa}$ applied to the saturable absorption region (carrier non-injection region) may be increased. As a result, single mode locking operation having light pulse with short time width may be attained. In addition, such a high electric resistance value between the first section and the second section of the second electrode may be attained only by separating the second electrode into the first section and the second section by the separation trench.

Further, in the first structure mode-locked laser diode device and the second structure mode-locked laser diode device, though not limited, the third compound semiconductor layer may have a quantum well structure including a well layer and a barrier layer. The thickness of the well layer may be from 1 nm to 10 nm both inclusive, and may be preferably from 1 nm to 8 nm both inclusive. The impurity doping concentration of the barrier layer may be from $2*10^{18}$ cm$^{-3}$ to $1*10^{20}$ cm$^{-3}$ both inclusive, and may be preferably from $1*10^{19}$ cm$^{-3}$ to $1*10^{20}$ cm$^{-3}$ both inclusive. It is to be noted that in some cases, such a mode-locked laser diode device is referred to as "a third structure mode-locked laser diode device" for convenience.

As described above, in the case where the thickness of the well layer composing the third compound semiconductor layer is specified as a value from 1 nm to 10 nm both inclusive, and the impurity doping concentration of the barrier layer composing the third compound semiconductor layer is specified as a value from $2*10^{18}$ cm$^{-3}$ to $1*10^{20}$ cm$^{-3}$ both inclusive, that is, in the case where the thickness of the well layer is thinned and carrier of the third compound semiconductor layer is increased, influence of piezoelectric polarization may be decreased, and a laser light source capable of generating single-peaked light pulse that has a short time width and small subpulse component may be obtained. Further, mode locking drive may be attained by low reverse bias voltage, and light pulse train in synchronization with an external signal (an electric signal and a light signal) may be generated. Doped impurity for the barrier layer may be silicon (Si). However, doped impurity is not limited thereto, and other substance such as oxygen (O) may be used.

The mode-locked laser diode device may be a laser diode device having a ridge stripe type separate confinement heterostructure (SCH structure). Further, the mode-locked laser diode device may be a laser diode device having an oblique ridge stripe type separate confinement heterostructure.

Further, in the first structure mode-locked laser diode device or the second structure mode-locked laser diode device, the width of the second electrode is desirably from 0.5 μm to 50 μm both inclusive, and is preferably from 1 μm to 5 μm both inclusive. The height of the ridge structure is desirably from 0.1 μm to 10 μm both inclusive, and is preferably from 0.2 μm to 1 μm both inclusive. The width of the separation trench that separates the second electrode into the first section and the second section is desirably 1 μm or more and 50% or less as much as the resonator length of the mode-locked laser diode device (hereinafter simply referred to as "resonator length"), and is preferably 10 μm or more and 10% or less as much as the resonator length. As the resonator length, 0.6 mm may be exemplified. However, the value is not limited thereto. Further, as the width of the ridge structure, 2 μm or less may be exemplified though not limited thereto. Further, as the lower limit value of the ridge structure, for example, 0.8 μm may be exemplified though not limited thereto. Distance (D) from the apex of a section of the second compound semiconductor layer located outside of both side faces of the ridge section to the third compound semiconductor layer (active layer) is preferably $1.0*10^{-7}$ m (0.1 μm) or more. By defining the distance (D) as above, the saturable absorption region may be securely formed in both sides (Y direction) of the third compound semiconductor layer. The upper limit of the distance (D) may be determined based on threshold current increase, temperature characteristics, deterioration of current increase ratio in long time drive and the like. It is to be noted that in the following description, resonator length direction is referred to as X direction, and the thickness direction of the laminated structure is referred to as Z direction.

Further, in the first structure mode-locked laser diode device or the second structure mode-locked laser diode device including the foregoing preferred forms, the second electrode may be composed of a palladium (Pd) single layer, a nickel (Ni) single layer, a platinum (Pt) single layer, a laminated structure of a palladium layer and a platinum layer in which the palladium layer is contacted with the second compound semiconductor layer, or a laminated structure of a palladium layer and a nickel layer in which the palladium layer is contacted with the second compound semiconductor layer. It is to be noted that, in the case where the lower metal layer is composed of palladium, and the upper metal layer is composed of nickel, the thickness of the upper metal layer is desirably 0.1 μm or more, and is preferably 0.2 μm or more. Further, the second electrode is preferably composed of the palladium (Pd) single layer. In this case, the thickness thereof is desirably 20 nm or more, and is preferably 50 nm or more. Further, the second electrode is preferably composed of a palladium (Pd) single layer, a nickel (Ni) single layer, a platinum (Pt) single layer, or a laminated structure of a lower metal layer and an upper metal layer in which the lower metal layer is contacted with the second compound semiconductor layer (however, the lower metal layer is composed of one metal selected from the group consisting of palladium, nickel, and platinum; and the upper metal layer is composed of a metal having etching rate in forming the separation trench in the second electrode in the after-mentioned step D equal to, similar to, or higher than etching rate of the lower metal layer). Further, an etching liquid used in forming the separation trench in the second electrode in the after-mentioned step D is desirably royal water, nitric acid, vitriolic acid, muriatic acid, or a mixed liquid composed of at least two types out of these acids (specifically, a mixed liquid composed of nitric acid and vitriolic acid, or a mixed liquid composed of vitriolic acid and muriatic acid). The width of the second electrode is desirably from 0.5 μm to 50 μm both inclusive, and is preferably from 1 μm to 5 μm both inclusive.

In the first structure mode-locked laser diode device or the second structure mode-locked laser diode device including the foregoing preferred structures and the foregoing preferred forms described above, the length of the saturable absorption region may be shorter than the length of the light emitting region. Further, the length of the second electrode (total length of the first section and the second section) may be shorter than the length of the third compound semiconductor layer (active layer). Specific examples of arrangement state of the first section and the second section of the second electrode may include the following:

1. a state in which one first section of the second electrode and one second section of the second electrode are provided, and the first section of the second electrode and the second section of the second electrode are arranged with a separation trench in between 2. a state in which one first section of the second electrode and two second sections of the second electrode are provided, an end of the first section is opposed to one second section with one separation trench in between, and the other end of the first section is opposed to the other second section with the other separation trench in between 3. a state in which two first sections of the second electrode and one second section of the second electrode are provided, one end of the second section is opposed to one first section with one separation trench in between, and the other end of the second section is opposed to the other first section with the other separation trench in between (that is, the second electrode has a structure in which the second section is sandwiched between the first sections) Further, more generally, examples of arrangement state of the first section and the second section of the second electrode include the following:

4. a state that N pieces of the first sections of the second electrode and (N−1) pieces of the second sections of the second electrode are provided, and the second section of the second electrode is sandwiched between the first sections of the second electrode 5. a state that N pieces of the second sections of the second electrode and (N−1) pieces of the first sections of the second electrode are provided, and the first section of the second electrode is sandwiched between the second sections of the second electrode.

It is to be noted that, in other words, the states 4 and 5 are described as follows:

4'. a state that N pieces of light emitting regions [carrier injection region, gain region] and (N−1) pieces of saturable absorption regions [carrier non-injection region] are provided, and the saturable absorption regions are sandwiched between the light emitting regions 5'. a state that N pieces of saturable absorption regions [carrier non-injection region] and (N−1) pieces of light emitting regions [carrier injection region, gain region] are provided, and the light emitting regions are sandwiched between the saturable absorption regions.

It is to be noted that, by adopting structures 3, 5, and 5', damage in the light output end face of the mode-locked laser diode device is less likely to occur.

The mode-locked laser diode device may be manufactured, for example, by the following method. That is, the mode-locked laser diode device may be manufactured, for example, by the following manufacturing method including the following respective steps:

A. a step of forming the laminated structure in which the first compound semiconductor layer that has the first conductivity type and is composed of GaN compound semiconductor, the third compound semiconductor layer that has the light emitting region and the saturable absorption region composed of GaN compound semiconductor, and the second compound semiconductor layer that has the second conductivity type different from the first conductivity type and is composed of GaN compound semiconductor are sequentially layered is formed on a substrate, B. a subsequent step of forming the strip-shaped second electrode on the second compound semiconductor layer, C. a subsequent step of etching at least a part of the second compound semiconductor layer with the use of the second electrode as an etching mask, and thereby forming the ridge stripe structure, and D. a subsequent step of forming a resist layer for forming the separation trench in the second electrode, subsequently forming the separation trench in the second electrode by wet etching method with the use of the resist layer as a wet etching mask, and thereby separating the second electrode into the first section and the second section by the separation trench.

The ridge stripe structure is formed by adopting the foregoing manufacturing method, that is, by etching at least part of the second compound semiconductor layer with the use of the strip-shaped second electrode as an etching mask. That is, the ridge stripe structure is formed by self alignment method by using the patterned second electrode as an etching mask. Thus, no joint misalignment exists between the second electrode and the ridge stripe structure. Further, the separation trench is formed in the second electrode by wet etching method. By adopting wet etching method as described above, deterioration of the optical and electric characteristics of the second compound semiconductor layer may be inhibited differently from dry etching method. Accordingly, deterioration of light emitting characteristics may be securely prevented.

In the step C, a part of the second compound semiconductor layer may be etched in the thickness direction, all of the second compound semiconductor layer may be etched in the thickness direction, the second compound semiconductor layer and the third compound semiconductor layer may be etched in the thickness direction, or part of the second compound semiconductor layer, the third compound semiconductor layer, and the first compound semiconductor layer may be etched in the thickness direction.

Further, where etching rate of the second electrode is $ER_0$ and etching rate of the laminated structure is $ER_1$ in forming the separation trench in the second electrode in the foregoing step D, $ER_0/ER_1 \geq 1*10$ is desirably satisfied, and $ER_0/ER_1 \geq 1*10^2$ is preferably satisfied. In the case where $ER_0/ER_1$ satisfies the foregoing relation, the second electrode is able to be securely etched without etching the laminated structure (or even if the laminated structure is etched, the etching portion is little.)

Further, in the first structure mode-locked laser diode device or the second structure mode-locked laser diode device including the foregoing preferred structures and the foregoing preferred forms described above, specifically, the laminated structure may be composed of AlGaInN compound semiconductor. Specific examples of AlGaInN compound semiconductor include GaN, AlGaN, GaInN, and AlGaInN. Further, such a compound semiconductor may include boron (B) atom, thallium (Tl) atom, arsenic (As) atom, phosphorus (P) atom, or antimony (Sb) atom according to needs. Further, the third compound semiconductor layer (active layer) structuring the light emitting region (gain region) and the saturable absorption region desirably has the quantum well structure. Specifically, the third compound semiconductor layer may have single quantum well structure [QW structure], or multiquantum well structure [MQW structure]. The third compound semiconductor layer (active layer) having the quantum well structure has a structure in which at least one well layer and at least one barrier layer are layered. As a combination of compound semiconductor composing the well layer and compound semiconductor composing the barrier layer, $(In_yGa_{(1-y)}N, GaN)$, $(In_yGa_{(1-y)}N, In_zGa_{(1-z)}N)$ [y>z], and $(In_yGa_{(1-y)}N, AlGaN)$ may be exemplified.

Further, in the first structure mode-locked laser diode device or the second structure mode-locked laser diode device including the foregoing preferred structures and the foregoing preferred forms described above, the second compound semiconductor layer may have a superlattice structure in which a p-type GaN layer and a p-type AlGaN layer are alternately layered. The thickness of the superlattice structure may be 0.7 μm or less. By adopting such a superlattice structure, while high refractive index necessary as a cladding layer is maintained, a series resistance component of the mode-locked laser diode device is able to be decreased, leading to realizing a low operation voltage of the mode-locked laser diode device. It is to be noted that, though the lower limit value of the thickness of the superlattice structure is not limited, the lower limit value is, for example, 0.3 μm. As the thickness of the p-type GaN layer composing the superlattice structure, a thickness from 1 nm to 5 nm both inclusive may be exemplified. As the thickness of the p-type AlGaN layer composing the superlattice structure, a thickness from 1 nm to 5 nm both inclusive may be exemplified. As the total number of layers of the p-type GaN layer and the p-type AlGaN layer, the number from 60 to 300 both inclusive may be exemplified. Further, the distance from the third compound semiconductor layer to the second electrode may be 1 μm or less, and preferably 0.6 μm or less. By defining the distance from the third compound semiconductor layer to the second electrode as described above, the thickness of the p-type second compound semiconductor layer having high resistance may be decreased, and the operation voltage of the mode-locked laser diode device may be decreased. It is to be noted that, though the lower limit value of the distance from the third compound semiconductor layer to the second electrode is not limited, for example, the lower limit value of the distance from the third compound semiconductor layer to the second electrode is 0.3 μm. Further, the second compound semiconductor layer may be doped with Mg at the level of $1*10^{19}$ $cm^{-3}$ or more. The absorption coefficient of the second compound semiconductor layer to light having 405 nm wavelength from the third compound semiconductor layer may be at least 50 $cm^{-1}$. The atom concentration of Mg comes from material physicality that the maximum electron hole concentration is shown at the value of $2*10^{19}$ $cm^{-3}$, and is a result of design in which the electron hole concentration is the maximum, that is, the specific resistance of the second compound semiconductor layer becomes the minimum. The absorption coefficient of the second compound semiconductor layer is defined in view of decreasing resistance of the mode-locked laser diode device as much as possible. As a result, in general, the absorption coefficient of light of the third compound semiconductor layer becomes 50 $cm^{-1}$. However, it is possible that the Mg dope amount is intentionally set to the concentration of $2*10^{19}$ $cm^{-3}$ or more in order to increase the absorption coefficient. In this case, the upper limit Mg dope amount for obtaining a practical electron hole concentration is, for example, $8*10^{19}$ $cm^{-3}$. Further, the second compound semiconductor layer may have a non-doped compound semiconductor layer and a p-type compound semiconductor layer from the third compound semiconductor layer side. The distance from the third compound semiconductor layer to the p-type compound semiconductor layer may be $1.2*10^{-7}$ m or less. By defining the distance from the third compound semiconductor layer to the p-type compound semiconductor layer as described above, internal loss may be inhibited in a range in which the internal quantum efficiency is not lowered. Thereby, threshold current density at which laser oscillation is started may be decreased. It is to be noted that, though the lower limit value of the distance from the third compound semiconductor layer to the p-type compound semiconductor layer is not limited, for example, the lower limit value is $5*10^{-8}$ m. Further, on both side faces of the ridge section, a laminated insulating film composed of $SiO_2$/Si laminated structure may be formed. The difference between the effective refractive index of the ridge section and the effective refractive index of the laminated insulating film may be from $5*10^{-3}$ to $1*10^{-2}$ both inclusive. By using such a laminated insulating film, even in the case of high output operation exceeding 100 mW, single fundamental lateral mode may be maintained. Further, the second compound semiconductor layer may have a structure in which, for example, a non-doped GaInN layer (p-side light guide layer), a non-doped AlGaN layer (p-side cladding layer), an Mg doped AlGaN layer (electron barrier layer), a superlattice structure (superlattice cladding layer) composed of a GaN layer (Mg doped)/AlGaN layer, and an Mg doped GaN layer (p-side contact layer) are layered from the third compound semiconductor layer side. The bandgap of compound semiconductor composing the well layer in the third compound semiconductor layer is desirably 2.4 eV or more. Further, the wavelength of laser light outputted from the third compound semiconductor layer (active layer) is desirably from 360 nm to 500 nm both inclusive, and is preferably from 400 nm to 410 nm both inclusive. It is needless to say that the foregoing various structures may be combined as appropriate.

In the first structure mode-locked laser diode device or the second structure mode-locked laser diode device, various GaN compound semiconductor layers composing the mode-locked laser diode device are sequentially formed over a substrate. Examples of the substrate may include a GaAs substrate, a GaN substrate, an SiC substrate, an alumina substrate, a ZnS substrate, a ZnO substrate, an AlN substrate, an LiMgO substrate, an $LiGaO_2$ substrate, an $MgAl_2O_4$ substrate, an InP substrate, an Si substrate, and a laminated body in which a foundation layer and a buffer layer are formed on the surface (main face) of the foregoing substrate in addition to a sapphire substrate. Mainly, in the case where the GaN compound semiconductor layer is formed on the substrate, the GaN substrate has the preference due to its small defect density. However, it is known that in the GaN substrate, its characteristics are changed from/to polarity, non-polarity, and semi-polarity according to the growth plane. Further, examples of methods of forming the various GaN compound semiconductor layer composing the mode-locked laser diode device may include metal organic chemical vapor deposition method (MOCVD method and MOVPE method), molecular beam epitaxy method (MBE method), and hydride vapor growth method in which halogen contributes to transfer or reaction and the like.

Examples of organic gallium source gas in MOCVD method may include trimethyl gallium (TMG) gas and triethyl gallium (TEG) gas. Examples of nitrogen source gas may include ammonia gas and hydrazine gas. Further, in forming the GaN compound semiconductor layer having n-type conductivity type, for example, silicon (Si) may be added as n-type impurity (n-type dopant). In forming the GaN compound semiconductor layer having p-type conductivity type, for example, magnesium (Mg) may be added as p-type impurity (p-type dopant). Further, in the case where aluminum (Al) or indium (In) is contained as a component atom of the GaN compound semiconductor layer, trimethyl aluminum (TMA) gas may be used as an Al source, and trimethyl indium (TMI) gas may be used as an In source. Further, monosilane gas ($SiH_4$ gas) may be used as an Si source, and ciclopentadienyl magnesium gas, methylciclopentadienyl magnesium, or bisciclopentadienyl magnesium ($Cp_2Mg$) may be used as an Mg source. It is to be noted that examples of n-type impurity (n-type dopant) may include Ge, Se, Sn, C, Te, S, O, Pd, and Po in addition to Si. Examples of p-type impurity (p-type dopant) may include Zn, Cd, Be, Ca, Ba, C, Hg, and Sr in addition to Mg.

Where the first conductive type is n type, the first electrode electrically connected to the first compound semiconductor layer having n-type conductivity type desirably has a single layer structure or a multilayer structure containing at least one metal selected from the group consisting of gold (Au), silver (Ag), palladium (Pd), Al (aluminum), Ti (titanium), tungsten (W), Cu (copper), Zn (zinc), tin (Sn), and indium (In), and for example, Ti/Au, Ti/Al, and Ti/Pt/Au may be exemplified. The first electrode is electrically connected to the first compound semiconductor layer. The first electrode may be formed on the first compound semiconductor layer, and the first electrode may be connected to the first compound semiconductor layer with a conductive material layer or a conducive substrate in between. The first electrode and the second electrode may be formed by PVD method such as vacuum evaporation method and sputtering method.

A pad electrode may be provided on the first electrode and the second electrode in order to obtain electrical connection to an external electrode or a circuit. The pad electrode desirably has a single layer structure or a multilayer structure containing at least one metal selected from the group consisting of Ti (titanium), aluminum (Al), Pt (platinum), Au (gold), and Ni (nickel). Otherwise, the pad electrode may have a multilayer structure exemplified as a Ti/Pt/Au multilayer structure and a Ti/Au multilayer structure.

In the first structure mode-locked laser diode device or the second structure mode-locked laser diode device, as described above, the reverse bias voltage is desirably applied between the first electrode and the second section (that is, the first electrode is a cathode and the second section is an anode). It is to be noted that a pulse current or a pulse voltage in synchronization with a pulse current or a pulse voltage applied to the first section of the second electrode may be applied to the second section of the second electrode. DC current bias may be applied to the second section of the second electrode. Further, a current may be flown from the second electrode to the first electrode through the light emitting region, and an external electric signal may be superimposed on the first electrode from the second electrode through the light emitting region. Thereby, laser light pulse may be synchronized with the external electric signal. Further, a light signal may enter from one end face of the laminated structure. Again, thereby the laser light pulse may be synchronized with the light signal. Further, in the second compound semiconductor layer, a non-doped compound semiconductor layer (for example, a non-doped GaInN layer or a non-doped AlGaN layer) may be formed between the third compound semiconductor layer and the electron barrier layer. Further, a non-doped GaInN layer as a light guide layer may be formed between the third compound semiconductor layer and the non-doped compound semiconductor layer. The uppermost layer of the second compound semiconductor layer may be occupied by an Mg doped GaN layer (p-side contact layer).

The laser diode assembly of the present disclosure is applicable to various fields such as the optical disc system, the communication field, the optical information field, the photoelectronic integration circuit, the field applying nonlinear optical phenomenon, the optical switch, the laser measurement field and various analysis fields, the ultrafast spectroscopy field, the multiphoton excitation spectroscopy field, the mass analysis field, the microspectroscopic field using multiphoton absorption, quantum control of chemical reaction, the nano three-dimensional processing field, various processing fields applying multiphoton absorption, the medical field, and the bio imaging field.

First Exemplified Embodiment

Figure 1B:
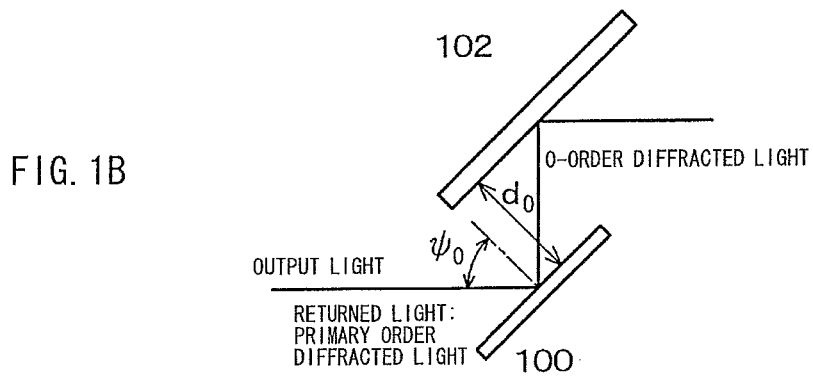
FIGS. 1B and 1C are enlarged schematic views of a diffraction grating section in the laser diode assembly of the first exemplified embodiment.
Figure 1C:
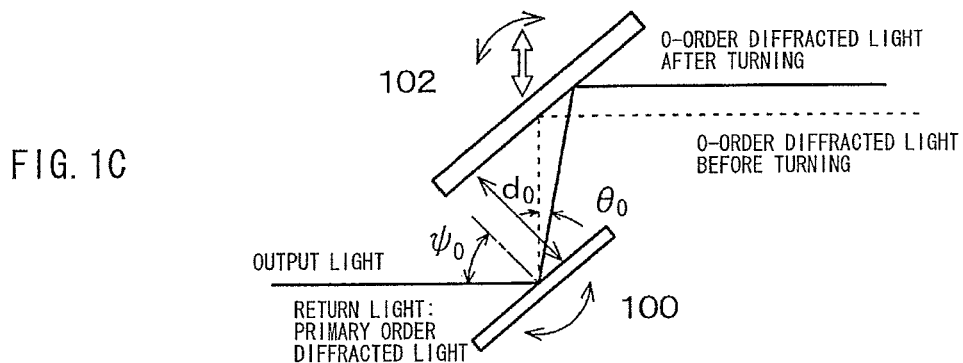
Figure 2:
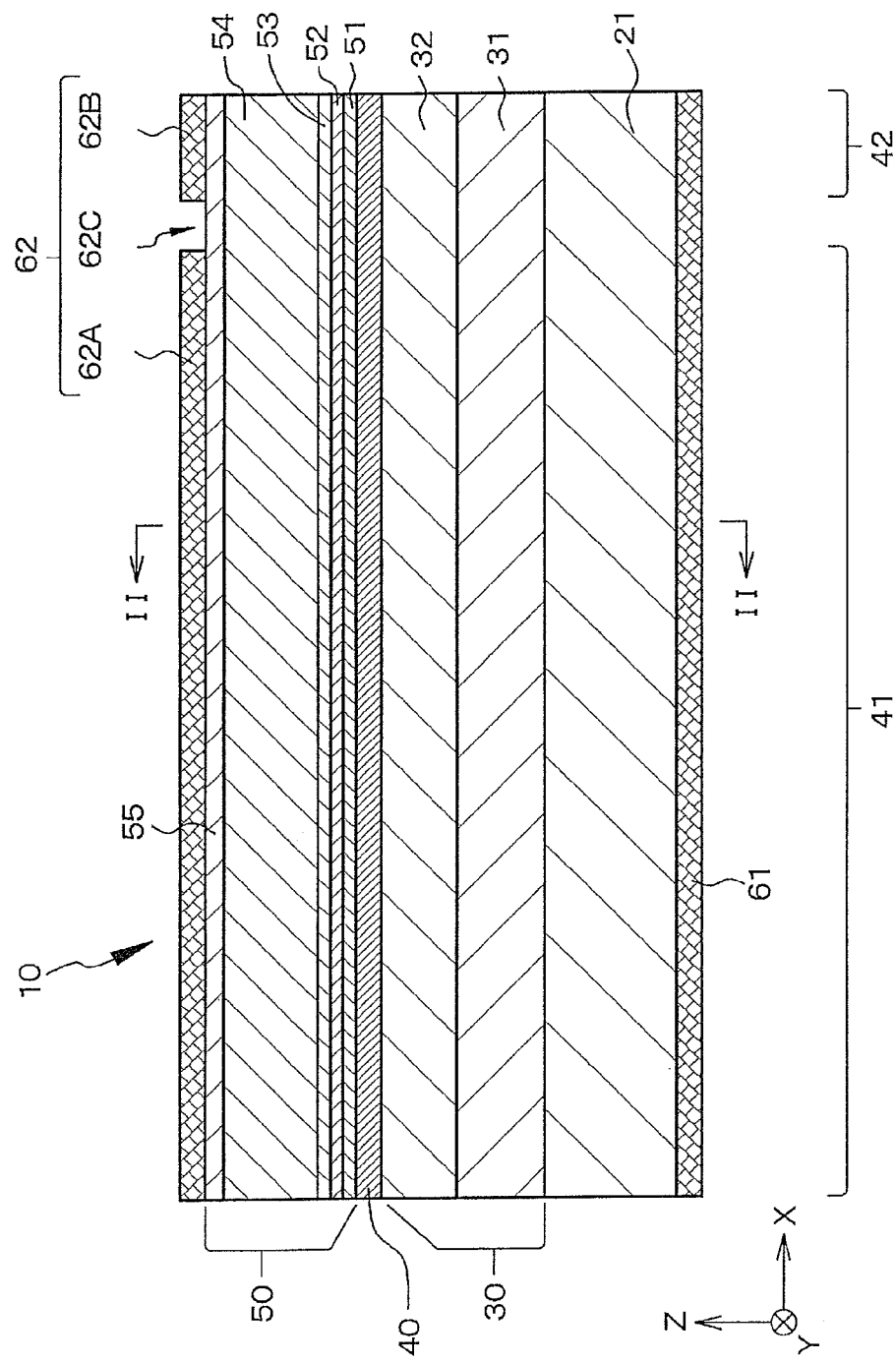
FIG. 2 illustrates a schematic end face view along direction in which a resonator of a mode-locked laser diode device in the first exemplified embodiment extends.
Figure 3:
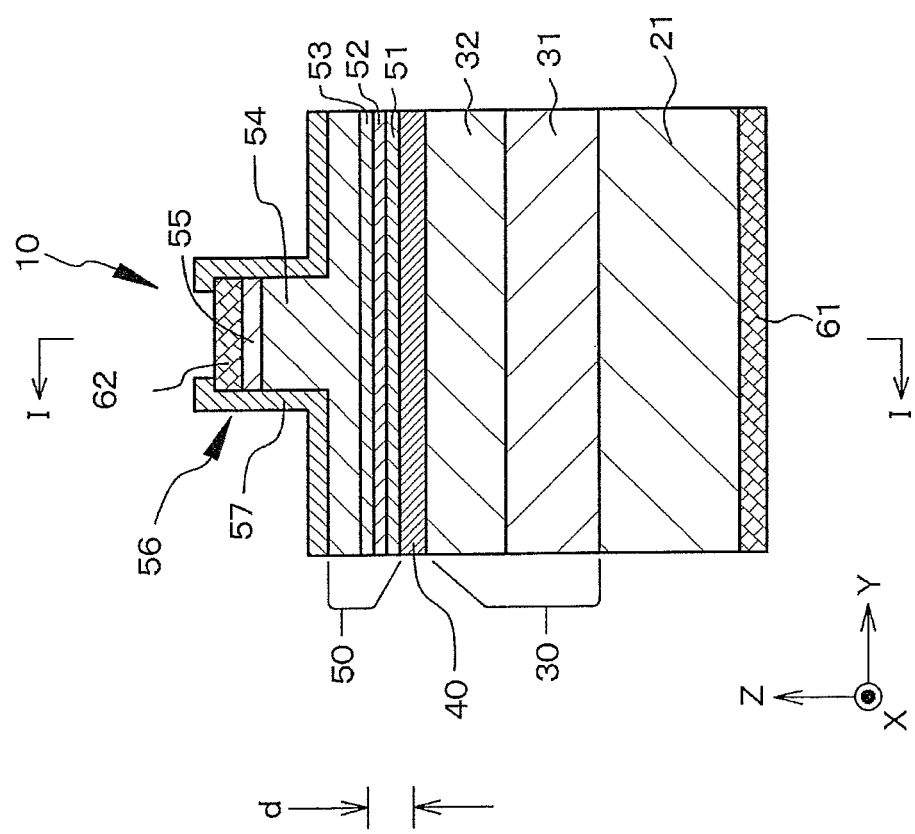
FIG. 3 is a schematic cross-sectional view along direction perpendicular to the direction in which the resonator of the mode-locked laser diode device of the first exemplified embodiment extends.

The first exemplified embodiment relates to a laser diode assembly according to the first embodiment. FIG. 1A illustrates a conceptual view of a laser diode assembly of a first exemplified embodiment. FIGS. 1B and 1C illustrate enlarged schematic views of a diffraction grating of the laser diode assembly of the first exemplified embodiment. Further, FIG. 2 illustrates a schematic end face view along direction in which a resonator of a mode-locked laser diode device in the first exemplified embodiment extends (schematic end face view cut along XZ plane). FIG. 3 illustrates a schematic cross-sectional view along direction perpendicular to the direction in which the resonator extends (schematic cross-sectional view cut along YZ plane). It is to be noted that FIG. 2 is a schematic end face view taken along line I-I of FIG. 3. FIG. 3 is a schematic cross sectional view taken along line II-II of FIG. 2.

The laser diode assembly of the first exemplified embodiment includes (A) a mode-locked laser diode device 10, and (B) a diffraction grating 100 that structures an external resonator, returns primary or more order diffracted light (in the first exemplified embodiment, specifically, primary diffracted light) to the mode-locked laser diode device 10, and outputs 0-order diffracted light outside. The diffraction grating 100 structures the external resonator, functions as an output coupler, and further functions as a wavelength selection device. An imaging section 101 for imaging an image of a light output end face of the mode-locked laser diode device on the diffraction grating is provided between the mode-locked laser diode device 10 and the diffraction grating 100.

The mode-locked laser diode device 10 in the first exemplified embodiment or second to fourth exemplified embodiments described later with light emitting wavelength of 405 nm band is composed of a first structure mode-locked laser diode device or a second structure mode-locked laser diode device, and is composed of a bisection type laser diode device. The bisection type laser diode device includes (a) a laminated structure in which a first compound semiconductor layer 30 that has a first conductivity type (in the first exemplified embodiment or the second to the fourth exemplified embodiments described later, specifically, n-type conductivity type) and is composed of GaN compound semiconductor, a third compound semiconductor layer (active layer) 40 that has a light emitting region (gain region) 41 and a saturable absorption region 42 composed of GaN compound semiconductor, and a second compound semiconductor layer 50 that has a second conductivity type different from the first conductivity type (in the first exemplified embodiment or the second to the fourth exemplified embodiments described later, specifically, p-type conductivity type) and is composed of GaN compound semiconductor are sequentially layered, (b) a strip-shaped second electrode 62 formed on the second compound semiconductor layer 50, and (c) a first electrode 61 electrically connected with the first compound semiconductor layer 30.

The mode-locked laser diode device 10 in the first exemplified embodiment or the second to the fourth exemplified embodiments described later is specifically a laser diode device having a ridge stripe type separate confinement heterostructure (SCH structure). More specifically, the mode-locked laser diode device 10 is a GaN laser diode device composed of index guide type AlGaInN developed for a Blu-ray optical disc system, and has a ridge structure (ridge stripe structure). The first compound semiconductor layer 30, the third compound semiconductor layer 40, and the second compound semiconductor layer 50 are specifically composed of AlGaInN compound semiconductor, and more specifically has the layer structure illustrated in Table 1 described below. In Table 1, the listed items are illustrated in the order from the layer farthest from an n-type GaN substrate 21 to the layer closest to the n-type GaN substrate 21. It is to be noted that band gap of the compound semiconductor composing the well layer in the third compound semiconductor layer 40 is 3.06 eV. The mode-locked laser diode device 10 in the first exemplified embodiment or the second to the fourth exemplified embodiments described later is provided on a (0001) plane of the n-type GaN substrate 21. The third compound semiconductor layer 40 has a quantum well structure. The (0001) plane of the n-type GaN substrate 21 is also called "C plane," and is a crystal plane having polarity.

TABLE 1

Second compound semiconductor layer 50
    p-type GaN contact layer (Mg doped) 55
    p-type GaN (Mg doped)/AlGaN superlattice cladding layer 54
    p-type AlGaN electron barrier layer (Mg doped) 53
    Non-doped AlGaN cladding layer 52
    Non-doped GaInN light guide layer 51
Third compound semiconductor layer 40
    GaInN quantum well active layer
    (well layer: $Ga_{0.92}In_{0.08}N$/barrier layer: $Ga_{0.98}In_{0.02}N$)
First compound semiconductor layer 30
    n-type GaN cladding layer 32
n-type AlGaN cladding layer 31
where
    well layer (two layers): 10.5 nm [non-doped]
    barrier layer (three layers): 14 nm [non-doped]

Further, a part of the p-type GaN contact layer 55 and part of the p-type GaN/AlGaN superlattice cladding layer 54 are removed by RIE method, and ridge structure (ridge section 56) is formed. On both sides of the ridge section 56, a laminated insulating film 57 composed of $SiO_2$/Si is formed. It is to be noted that the $SiO_2$ layer is the lower layer and the Si layer is the upper layer. The difference between the effective refractive index of the ridge section 56 and the effective refractive index of the laminated insulating film 57 is from $5*10^{-3}$ to $1*10^{-2}$ both inclusive, and is specifically $7*10^{-3}$. On the p-type GaN contact layer 55 corresponding to the apex of the ridge section 56, the second electrode (p-side ohmic electrode) 62 is formed. Meanwhile, on the rear face of the n-type GaN substrate 21, the first electrode (n-side ohmic electrode) 61 composed of Ti/Pt/Au is formed.

In the mode-locked laser diode device 10 in the first exemplified embodiment or the second to the fourth exemplified embodiments described later, the p-type AlGaN electron barrier layer 53, the p-type GaN/AlGaN superlattice cladding layer 54, and the p-type GaN contact layer 55 that are Mg-doped compound semiconductor layers are arranged not to overlap with each other as much as possible in the light density distribution generated from the third compound semiconductor layer 40 and regions in the vicinity thereof. Thereby, internal loss is inhibited in a range in which internal quantum efficiency is not lowered. Thereby, threshold current density at which laser oscillation is started is decreased. Specifically, the distance d from the third compound semiconductor layer 40 to the p-type AlGaN electron barrier layer 53 was set to 0.10 μm, the height of the ridge section (ridge structure) was set to 0.30 μm, the thickness of the second compound semiconductor layer 50 located between the second electrode 62 and the third compound semiconductor layer 40 was set to 0.50 μm, and the thickness of a section of the p-type GaN/AlGaN superlattice cladding layer 54 located below the second electrode 62 was set to 0.40 μm.

Further, in the mode-locked laser diode device 10 in the first exemplified embodiment or the second to the fourth exemplified embodiments described later, the second electrode 62 is separated into a first section 62A for obtaining forward bias state by flowing a DC current to the first electrode 61 through the light emitting region (gain region) 41 and a second section 62B for adding electric field to the saturable absorption region 42 (the second section 62B for adding reverse bias voltage $V_{sa}$ to the saturable absorption region 42) by a separation trench 62C. The electric resistance value (also referred to as "separating resistance value") between the first section 62A and the second section 62B of the second electrode 62 is $1*10$ times or more as much as the electric resistance value between the second electrode 62 and the first electrode 61, and is specifically $1.5*10^3$ times as much as the electric resistance value between the second electrode 62 and the first electrode 61. Further, the electric resistance value (separating resistance value) between the first section 62A and the second section 62B of the second electrode 62 is $1*10^2 \Omega$ or more, and is specifically $1.5*10^4 \Omega$.

Further, in the laser diode assembly in the first exemplified embodiment or the second exemplified embodiment described later, the diffraction grating 100 is composed of a holographic diffraction grating in which 3600 grooves are formed per mm.

Figure 12A:
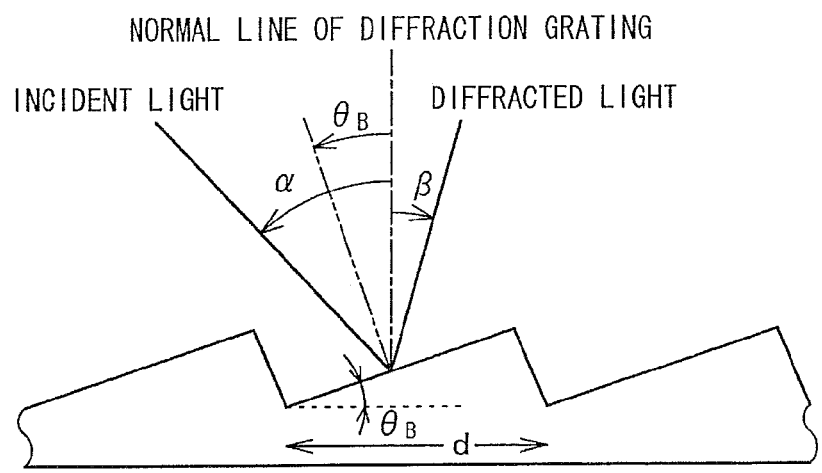
FIGS. 12A and 12B are schematic partial cross-sectional views of a diffraction grating.

As illustrated in FIG. 12A, light with wavelength λ enters a reflective diffraction grating at angle α, and is diffracted at angle β, where the angles α and β are an angle from the normal line of the diffraction grating, and counterclockwise direction is regarded as positive direction. Accordingly, grating formula is as follows, where N is the number of grooves per 1 mm of the diffraction grating (inverse number of diffraction grating cycle), and m is a diffraction order (m=0, +/−1, +/−2 and so on).

$$\sin(\alpha)+\sin(\beta)=N \cdot m \cdot \lambda$$

In the case where incident light has a specular reflection relation with m order diffracted light with respect to a slope face of a groove, most energy concentrates on the m order diffracted light. At this time, the following formula is established where a groove tilt is referred to as a blaze angle, and the blaze angle is expressed by $\theta_B$.

$$\theta_B=(\alpha+\beta)/2$$

Further, at this time, the following formula is established where the wavelength is referred to as blaze wavelength, and the blaze wavelength is expressed by $\lambda_B$.

$$\lambda_B=\{2/(N \cdot m)\}\sin(\theta_B) \cdot \cos(\alpha-\theta_B)$$

Figure 12B:
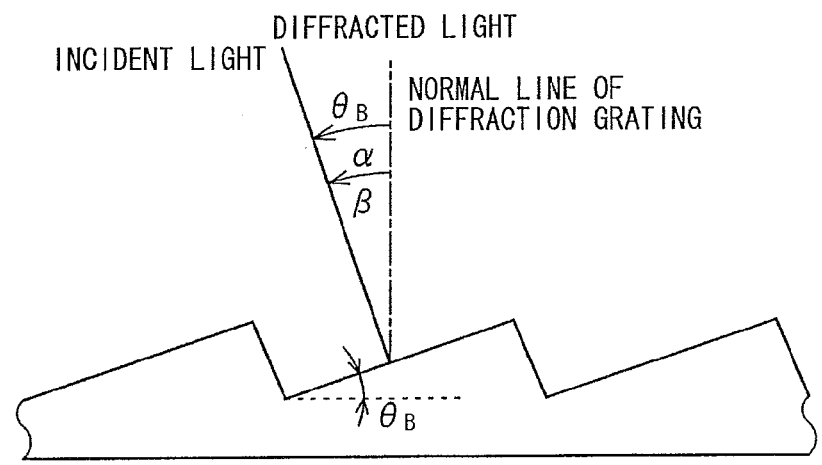

At this time, as illustrated in FIG. 12B, $\alpha=\beta=\theta_B$ is established where wavelength when+primary diffracted light is returned to the incident light direction is expressed by $\lambda_1$. As a result, the following formula is established $$\lambda_1=(2/N)\sin(\theta_B) \qquad (A)$$

Such arrangement is referred to as Littrow configuration.

In the mode-locked laser diode device 10 in the first exemplified embodiment or the second to the fourth exemplified embodiments described later, an absent reflection coating layer (AR) is formed on the light output end face opposed to the imaging section 101. Meanwhile, a high reflecting coating layer (HR) is formed on the end face opposed to light output end face in the mode-locked laser diode device 10. The saturable absorption region 42 is provided on the end face side opposed to light output end face in the mode-locked laser diode device 10. Examples of the absent reflection coating layer (low reflecting coating layer) include a laminated structure composed of at least two types of layers selected from the group consisting of a titanium oxide layer, a tantalum oxide layer, a zirconia oxide layer, a silicon oxide layer, and an aluminum oxide layer.

Pulse repetition frequency of the mode-locked laser diode device 10 in the first exemplified embodiment or the second to the fourth exemplified embodiments described later is set to 1 GHz. It is to be noted that repetition frequency f of light pulse train is determined by external resonator length X' as expressed by the following formula, where c represents light velocity and n represents refractive index of the waveguide.

$$f=c/(2n \cdot X')$$

In the laser diode assembly of the first exemplified embodiment, the imaging section 101 is formed from a lens having positive power, specifically is formed from an aspheric convex lens having a focal length of 4.5 mm. Distance (X') between the end face opposed to the light output end face of the mode-locked laser diode device 10 and the diffraction grating 100 is 150 mm. In this case, in the laser diode assembly of the first exemplified embodiment, the following formulas are established, where the length in the lateral direction of laser light on the light output end face of the mode-locked laser diode device is $L_1$ and the length in the lateral direction of an image on the light output end face of the mode-locked laser diode device that is imaged on the diffraction grating is $L_2$.

$L_1 = 1.6 \, \mu m$ $L_2 = 53 \, \mu m$

At this time, $20 \leq L_2/L_1 \leq 50$ is satisfied.

Wavelength of laser light outputted from the mode-locked laser diode device 10 has a certain wavelength range. In the first exemplified embodiment, a turning unit (not illustrated) for turning the diffraction grating 100 is included. The turning unit is composed of a piezoelectric device. The diffraction grating 100 is turned by displacement of the piezoelectric device generated by applying a voltage to the piezoelectric device. The diffraction grating 100 is turned centering on an axis line (not illustrated) perpendicular to the plane of paper of FIG. 1 by the turning unit. It is to be noted that, in FIG. 1C, laser light entering the diffraction grating 100 at incident angle $\Psi_0$ before turning the diffraction grating 100 is indicated by a full line, 0-order diffracted light outputted from the diffraction grating 100 is indicated by a dashed line, and 0-order diffracted light outputted from the diffraction grating 100 after turning the diffraction grating 100 by $\theta_0$ deg in clockwise direction is indicated by a full line. As a result of turning the diffraction grating 100, $\theta_B$ in the foregoing formula (A) is changed, and $\lambda_1$ is changed. That is, though the primary order diffracted light is returned to the mode-locked laser diode device 10, the wavelength of the primary diffracted light is able to be changed, and the diffraction grating 100 functions as a wavelength selection device. Accordingly, the wavelength of laser light to be returned to the mode-locked laser diode device is able to be controlled by turning the diffraction grating 100 by operation of the turning unit. Further, a reflecting mirror 102 for reflecting the 0-order diffracted light outputted from the diffraction grating 100 is further included, and a correction mechanism (not illustrated) for correcting a shift of a light path of the 0-order diffracted light reflected by the reflecting mirror 102 resulting from turning of the diffraction grating 100 by operation of the turning unit is further included. The correction mechanism is specifically composed of a piezoelectric device. The laser light (0-order diffracted light) reflected by the reflecting mirror 102 is collimated by a collimation lens 103 to become parallel beam, which is provided as laser output.

In the case where the selection wavelength is changed by changing the angle of the diffraction grating 100, as illustrated in FIG. 1C, direction in which the 0-order diffracted light is outputted is changed. Thus, the reflecting mirror 102 to retain relation in parallel with the diffraction grating 100 is arranged and the change of the 0-order diffracted light associated with wavelength selection is inhibited. The reflecting mirror 102 arranged in parallel with the diffraction grating 100 includes the correction mechanism with which distance from the diffraction grating 100 is adjusted according to the following formula (B), and the change of output position of the 0-order diffracted light associated with the angle change of the diffraction grating 100 is able to be corrected. Specifically, the reflecting mirror 102 is turned centering on an axis line (not illustrated) perpendicular to the plane of paper of FIG. 1, and retains position relation in parallel with the diffraction grating 100. Further, the reflecting mirror 102 is moved in parallel in the diffraction grating 100 direction.

$$d_0 \cdot \sin(\Psi_0)/\sin(\theta_0+\Psi_0) \qquad (B)$$

In the formula, $d_0$ represents distance (gap) between the diffraction grating 100 and the reflecting mirror 102 in the case where wavelength as reference is outputted, $\Psi_0$ represents incident angle of laser light to the diffraction grating 100 in the case where the wavelength as reference is outputted, and $\theta_0$ represents angle change amount of the diffraction grating 100 to the wavelength as reference.

Light beam entering the diffraction grating 100 and light beam outputted from the reflecting mirror 102 are in parallel with each other, distance between the respective light beams is given by the following formula.

$$2d_0 \cdot \sin(\Psi_0+\theta_0)$$

The distance between the light beams depends on $\theta_0$. Thus, the distance between the diffraction grating 100 and the reflecting mirror 102 may be changed while the diffraction grating 100 and the reflecting mirror 102 are kept in parallel with each other so that the distance between the respective light beams is not changed according to the change of $\theta_0$. Such adjustment of the distance is given by the foregoing Formula (B). To move the reflecting mirror 102 in parallel with direction of the diffraction grating 100, for example, the reflecting mirror 102 may be arranged on the same turning platform as that of the diffraction grating 100, and the reflecting mirror 102 may be moved by using a piezoelectric device or the like so that the distance from the diffraction grating 100 satisfies the foregoing Formula (B) in association with turning of the turning platform.

Laser light returned from the diffraction grating 100 to the mode-locked laser diode device 10 is spatially dispersed by the diffraction grating 100. Thus, as described above, the wavelength of the laser light returned to the mode-locked laser diode device 10 is able to be selected by setting the angle $\theta_0$ of the diffraction grating 100 as appropriate. 0-order diffracted light from the diffraction grating 100 (reflected light in the diffraction grating 100) is extracted as output from the diffraction grating 100 as an external resonator.

The resonator length of the mode-locked laser diode device 10 was set to 600 μm, the length of the first section 62A, the length of the second section 62B, and the length of the separation trench 62C of the second electrode 62 were respectively set to 580 μm, 10 μm, and 10 μm. In the laser diode assembly of the first exemplified embodiment including the foregoing mode-locked laser diode device 10, in the case where a current flown to the first section 62A of the second electrode 62 was 90 milliampere and a reverse bias voltage applied to the first section 62A of the second electrode 62 was 18 volt, average power of 12.2 milliwatt was obtained.

Figure 13:
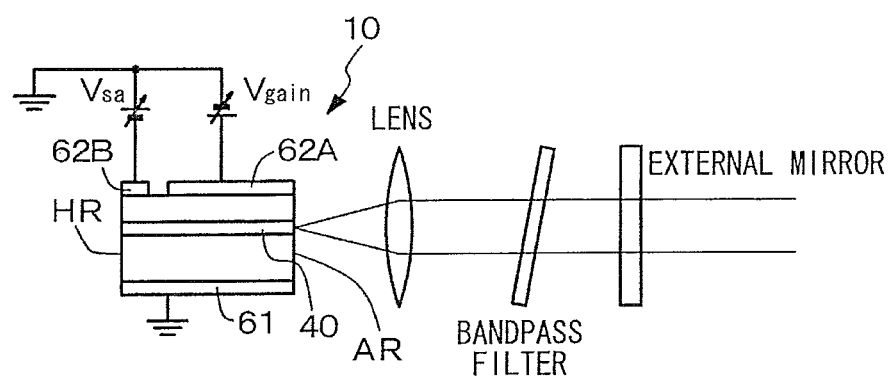
FIG. 13 is a conceptual view of an existing laser diode assembly.

Meanwhile, in a laser diode assembly composed of a combination of a bandpass filter ($\Delta\lambda=0.8$ nm) and a partial transmissive mirror (reflectance: 20%) illustrated in FIG. 13 under the same drive conditions using the same mode-locked laser diode device 10, only average power of 7.7 milliwatt was obtained.

In the laser diode assembly of the first exemplified embodiment, the imaging section imaging an image of the light output end face of the mode-locked laser diode device on the diffraction grating is included between the mode-locked laser diode device and the diffraction grating. That is, laser light that is outputted from the light output end face of the mode-locked laser diode device and enters the diffraction grating is not parallel light beam. Thus, mode locking operation is able to be inhibited from being unstable.

As described above, the second electrode 62 having a separating resistance value of $1*10^2\Omega$ or more is desirably formed on the second compound semiconductor layer 50. In the case of the GaN laser diode device, mobility in the compound semiconductor having p-type conductivity type is small differently from in the existing GaAs laser diode device. Thus, it is possible that the electric resistance value between the first section 62A and the second section 62B of the second electrode 62 becomes 10 times or more as much as the electric resistance value between the second electrode 62 and the first electrode 61, or the electric resistance value between the first section 62A and the second section 62B of the second electrode 62 becomes $1*10^2\Omega$ or more without setting high resistance of the second compound semiconductor layer 50 having p-type conductivity type by ion injection or the like but by separating the second electrode 62 formed on the second compound semiconductor layer 50 by the separation trench 62C.

Requested characteristics of the second electrode 62 are as follows:

1. A function as an etching mask in etching the second compound semiconductor layer 50 is included.
2. The second electrode 62 is able to be wet-etched without deteriorating optical and electric characteristics of the second compound semiconductor layer 50.
3. Contact specific resistance value of $10^{-2}$ $\Omega \cdot cm^2$ or less is shown in the case where the second electrode 62 is formed on the second compound semiconductor layer 50.
4. In the case of a laminated structure, a material composing the lower layer metal layer has large work function, shows low contact specific resistance value to the second compound semiconductor layer 50, and is able to be wet-etched.
5. In the case of a laminated structure, a material composing the upper layer metal layer has resistance to etching in forming the ridge structure (for example, $Cl_2$ gas used in RIE method), and is able to be wet-etched.

In the first exemplified embodiment or the second to the fourth exemplified embodiments described later, the second electrode 62 is formed from a Pd single layer having a thickness of 0.1 μm.

It is to be noted that the thickness of the p-type GaN/AlGaN superlattice cladding layer 54 having a superlattice structure in which a p-type GaN layer and a p-type AlGaN layer are alternately layered is 0.7 μm or less, and specifically 0.4 μm. The thickness of the p-type GaN layer composing the superlattice structure is 2.5 nm. The thickness of the p-type AlGaN layer composing the superlattice structure is 2.5 nm. The total number of layers of the p-type GaN layer and the p-type AlGaN layer is 160. Further, the distance from the third compound semiconductor layer 40 to the second electrode 62 is 1 μm or less, and specifically 0.5 μm. Further, the p-type AlGaN electron barrier layer 53, the p-type GaN/AlGaN superlattice cladding layer 54, and the p-type GaN contact layer 55 composing the second compound semiconductor layer 50 are doped with Mg at the level of $1*10^{19}$ $cm^{-3}$ or more (specifically at the level of $2*10^{19}$ $cm^{-3}$). The absorption coefficient of the second compound semiconductor layer 50 to light with 405 nm wavelength is at least 50 $cm^{-1}$, and specifically 65 $cm^{-1}$. Further, the second compound semiconductor layer 50 is provided with the non-doped compound semiconductor layer (the non-doped GaInN light guide layer 51 and the non-doped AlGaN cladding layer 52) and the p-type compound semiconductor layer from the third compound semiconductor layer side. The distance d from the third compound semiconductor layer 40 to the p-type compound semiconductor layer (specifically, the p-type AlGaN electron barrier layer 53) is $1.2*10^{-7}$ m or less, and specifically 100 nm.

Figure 10:
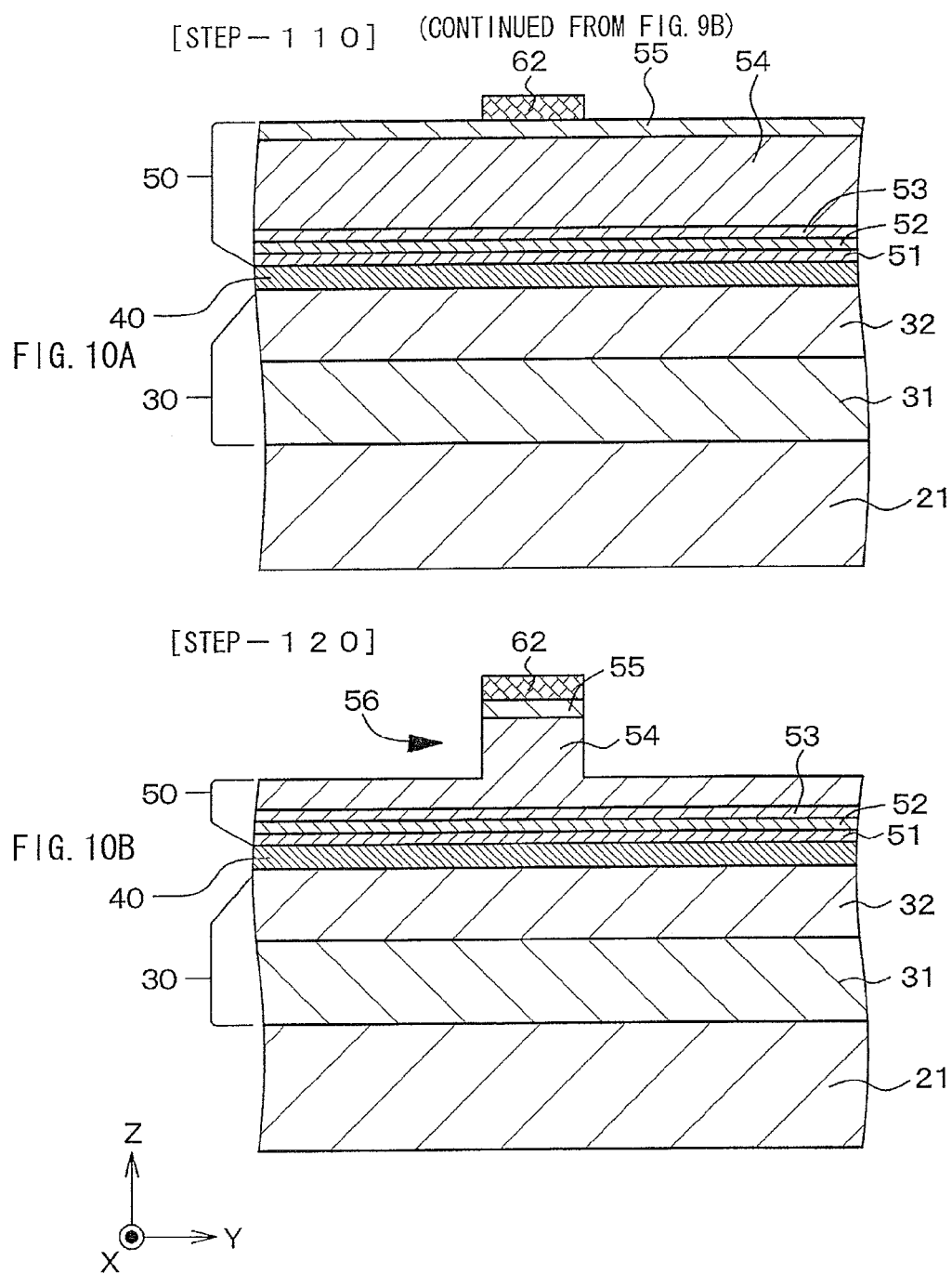
FIGS. 10A and 10B are schematic partial cross-sectional views of a substrate and the like for explaining the manufacturing method of the mode-locked laser diode device of the first exemplified embodiment following FIG. 9B.
Figure 11:
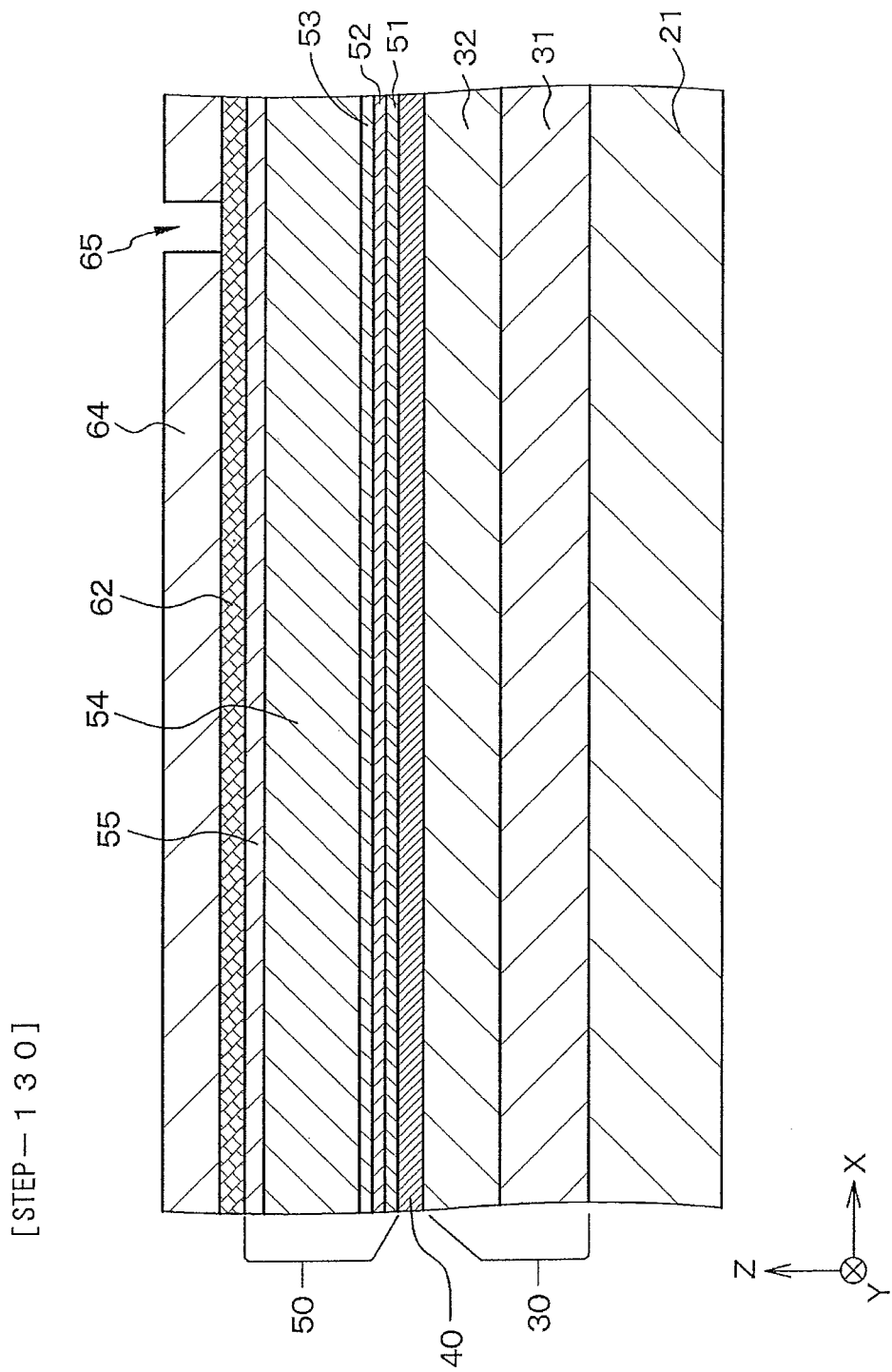
FIG. 11 is a schematic partial end face view of the substrate and the like for explaining the manufacturing method of the mode-locked laser diode device of the first exemplified embodiment following FIG. 10B.

A description will be given of a method of manufacturing the mode-locked laser diode device in the first exemplified embodiment or the second to the third exemplified embodiments described later with reference to FIGS. 9A, 9B, 10A, 10B, and 11. FIGS. 9A, 9B, 10A, and 10B are schematic partial cross sectional views where the substrate and the like are cut in YZ plane. FIG. 11 is a schematic partial end face view where the substrate and the like are cut in XZ plane.

[Step-100]

Figure 9:
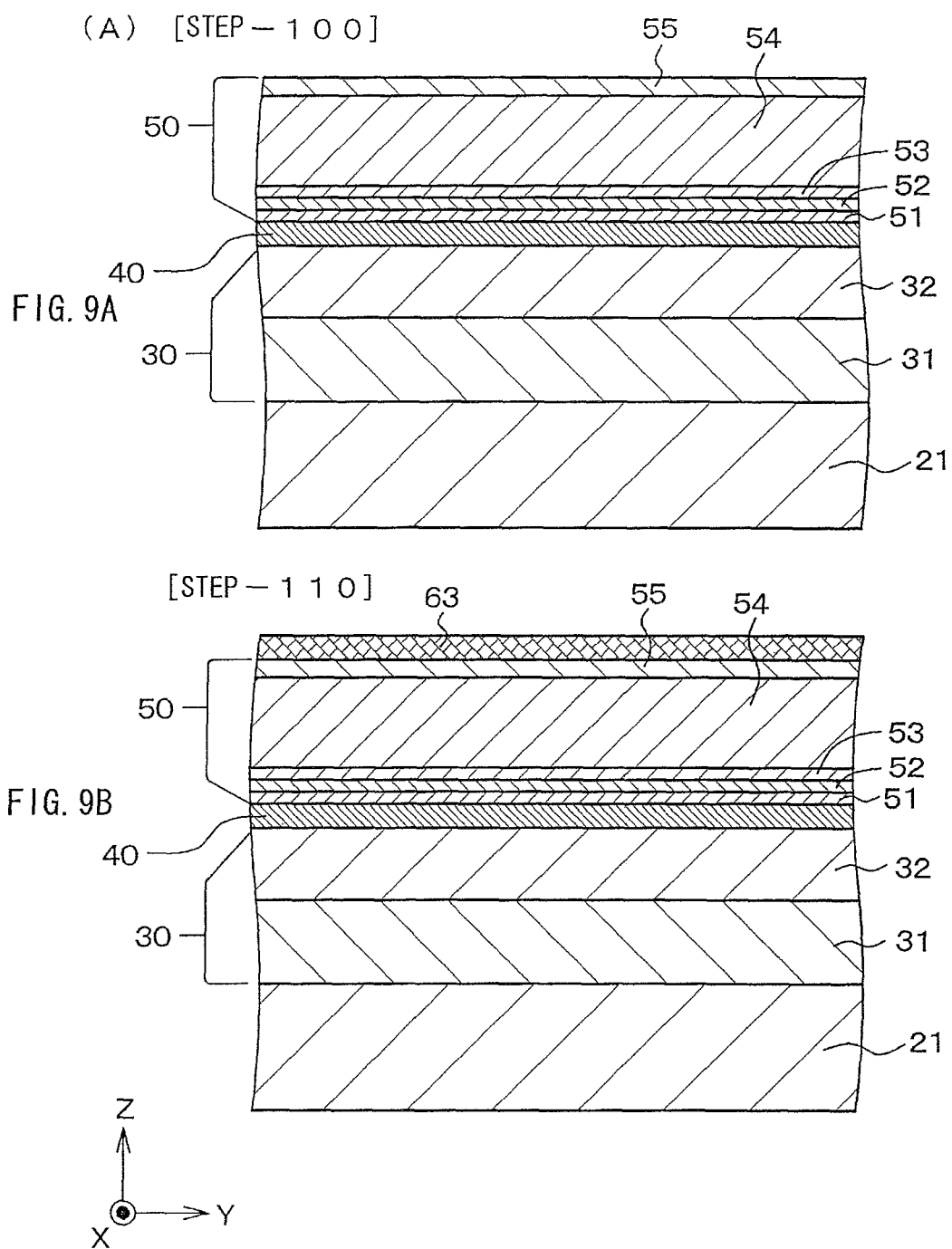
FIGS. 9A and 9B are schematic partial cross-sectional views of a substrate and the like for explaining a manufacturing method of the mode-locked laser diode device of the first exemplified embodiment.

First, a laminated structure in which the first compound semiconductor layer 30 that has first conductivity type (n-type conductivity type) and is composed of GaN compound semiconductor, the third compound semiconductor layer (active layer 40) including the light emitting region (gain region) 41 and the saturable absorption region 42 composed of GaN compound semiconductor, and the second compound semiconductor layer 50 that has second conductivity type (p-type conductivity type) different from the first conductivity type and is composed of GaN compound semiconductor are sequentially layered is formed on a substrate, specifically on (0001) plane of the n-type GaN substrate 21 based on known MOCVD method (refer to FIG. 9A).

[Step-110]

After that, the strip-shaped second electrode 62 is formed on the second compound semiconductor layer 50. Specifically, after a Pd layer 63 is formed over the entire face of the second compound semiconductor layer 50 based on vacuum evaporation method (refer to FIG. 9B), a strip-shaped etching-use resist layer is formed on the Pd layer 63 based on photolithography technology. After the Pd layer 63 not covered with the etching-use resist layer is removed by using royal water, the etching-use resist layer is removed. Thereby, the structure illustrated in FIG. 10A is able to be obtained. It is to be noted that the strip-shaped second electrode 62 may be formed on the second compound semiconductor layer 50 based on liftoff method.

[Step-120]

Next, at least a part of the second compound semiconductor layer 50 is etched (specifically, a part of the second compound semiconductor layer 50 is etched) with the use of the second electrode 62 as an etching-use mask to form the ridge structure. Specifically, a part of the second compound semiconductor layer 50 is etched with the use of the second electrode 62 as an etching-use mask based on RIE method using $Cl_2$ gas. Thereby, the structure illustrated in FIG. 10B is able to be obtained. As described above, the ridge structure is formed by self-alignment method by using the second electrode 62 patterned in the shape of a strip as an etching-use mask. Thus, misalignment does not occur between the second electrode 62 and the ridge structure.

[Step-130]

After that, a resist layer 64 for forming the separation trench in the second electrode 62 is formed (refer to FIG. 11). It is to be noted that referential number 65 represents an aperture provided in the resist layer 64 for forming the separation trench. Next, the separation trench 62C is formed in the second electrode 62 by wet etching method with the use of the resist layer 64 as a wet etching-use mask, and thereby the second electrode 62 is separated into the first section 62A and the second section 62B by the separation trench 62C. Specifically, royal water is used as an etching liquid, and the entire body is dipped into the royal water for about 10 seconds, and thereby the separation trench 62C is formed in the second electrode 62. After that, the resist layer 64 is removed. Accordingly, the structure illustrated in FIG. 2 and FIG. 3 is able to be obtained. As described above, differently from dry etching method, by adopting wet etching method, optical characteristics and electric characteristics of the second compound semiconductor layer 50 are not deteriorated. Thus, light emitting characteristics of the mode-locked laser diode device are not deteriorated. It is to be noted that, if dry etching method is adopted, there is a possibility that internal loss $\alpha_i$ of the second compound semiconductor layer 50 is increased, the threshold voltage is increased, and light output is lowered. In this case, where an etching rate of the second electrode 62 is $ER_0$, and an etching rate of the laminated body is $ER_1$, the following formula is established:

$$ER_0/ER_1 \sim 1*10^2$$

As described above, since the high etching selection ratio exists between the second electrode 62 and the second compound semiconductor layer 50, the second electrode 62 is able to be surely etched without etching the laminated structure (or even if the laminated structure is etched, the etching amount is slight). It is to be noted that $ER_0/ER_1 \geq 1*10$ is desirably satisfied, and $ER_0/ER_1 \geq 1*10^2$ is preferably satisfied.

The second electrode may have a laminated structure composed of a lower layer metal layer made of palladium (Pd) having a thickness of 20 nm and an upper layer metal layer made of nickel (Ni) having a thickness of 200 nm. In wet etching with the use of royal water, nickel etching rate is about 1.25 times as much as palladium etching rate.

[Step-140]

After that, the n-side electrode is formed and the substrate is cleaved. Further, packaging is made, and thereby the mode-locked laser diode device 10 is able to be formed.

In general, resistance R ($\Omega$) of a semiconductor layer is expressed as follows by using specific resistance value $\rho$ ($\Omega \cdot m$) of a material composing the semiconductor layer, length of the semiconductor layer $X_0$ (m), cross-sectional area S of the semiconductor layer ($m^2$), carrier density n ($cm^{-3}$), electric charge amount e (C), and mobility $\mu$ ($m^2/V$ sec).

$$R = (\rho \cdot X_0)/S$$

$$= X_0/(n \cdot e \cdot \mu \cdot S)$$

Since mobility of the p-type GaN semiconductor is smaller by two digit or more than that of the p-type GaAs semiconductor, the electric resistance value is easily increased. Thus, it is found that the electric resistance value of the laser diode device having a ridge structure with small cross-sectional area being 1.5 µm wide and 0.35 µm high becomes a large value based on the foregoing formula.

An electric resistance value between the first section 62A and the second section 62B of the second electrode 62 of the fabricated mode-locked laser diode device 10 was measured by four terminal method. In the case where the width of the separation trench 62C was 20 µm, the electric resistance value between the first section 62A and the second section 62B of the second electrode 62 was 15 kΩ. Further, in the fabricated mode-locked laser diode device 10, forward bias state was obtained by flowing a DC current from the first section 62A of the second electrode 62 to the first electrode 61 through the light emitting region 41, and electric field was added to the saturable absorption region 42 by applying the reverse bias voltage $V_{sa}$ between the first electrode 61 and the second section 62B of the second electrode 62, and thereby self-pulsation operation was able to be performed. That is, the electric resistance value between the first section 62A and the second section 62B of the second electrode 62 was ten times or more as large as the electric resistance value between the second electrode 62 and the first electrode 61, or $1*10^2 \Omega$ or more. Thus, flow of leakage current from the first section 62A of the second electrode 62 to the second section 62B of the second electrode 62 was able to be inhibited securely. As a result, the light emitting region 41 was able to be in forward bias state, the saturable absorption region 42 was securely able to be in reverse bias state, and single mode self-pulsation operation was able to be securely performed.

Second Exemplified Embodiment

Figure 4A:
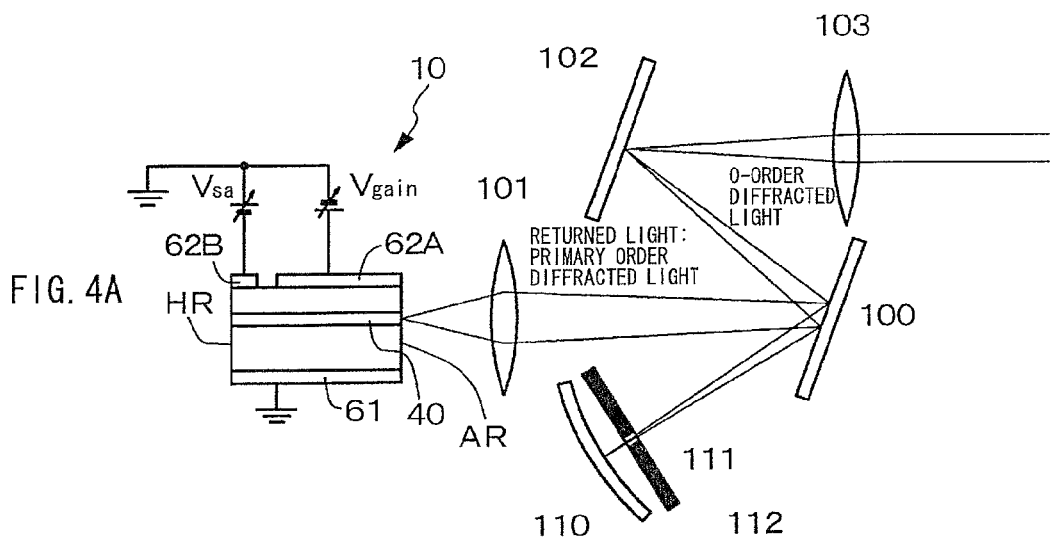
FIG. 4A is a conceptual view of a laser diode assembly of a second exemplified embodiment.
Figure 4B:
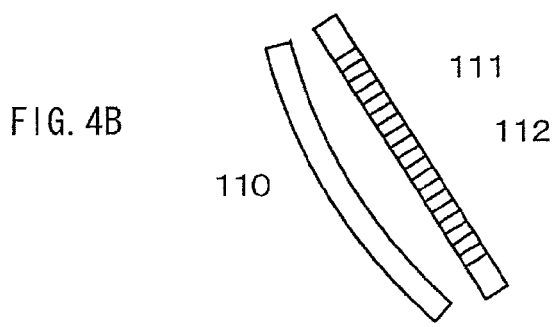
FIGS. 4B and 4C illustrate enlarged schematic views of a diffraction grating of the laser diode assembly of the second exemplified embodiment.
Figure 4C:
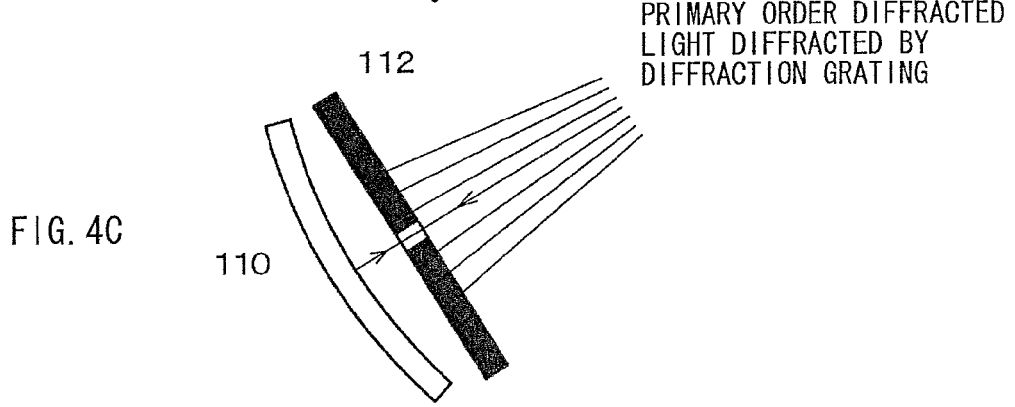

The second exemplified embodiment relates to a laser diode assembly according to the second embodiment. FIG. 4A illustrates a conceptual view of the laser diode assembly of the second exemplified embodiment. FIGS. 4B and 4C illustrate enlarged schematic views of the diffraction grating of the laser diode assembly of the second exemplified embodiment.

The laser diode assembly of the second exemplified embodiment includes (A) the mode-locked laser diode device 10, (B) the diffraction grating 100 that outputs 0-order diffracted light outside, and (C) an external resonator 110 composed of a reflecting mirror that reflects primary or more order diffracted light from the diffraction grating 100 and returns the reflected light to the mode-locked laser diode device 10 thorough the diffraction grating. The imaging section 101 for imaging laser light outputted from the mode-locked laser diode device 10 on the external resonator 110 is included between the mode-locked laser diode device 10 and the diffraction grating 100. The diffraction grating 100 functions as an output coupler. The diffraction grating 100 and the external resonator 110 function as a wavelength selection device.

In the laser diode assembly of the second exemplified embodiment, the imaging section 101 is formed from a lens having positive power, specifically is formed with a convex lens. The reflecting mirror composing the external resonator 110 is formed with a concave mirror. It is to be noted that the curvature radius of the concave mirror is equal to the distance from the diffraction grating 100 to the concave mirror. That is, the center of curvature of the concave mirror is included in a region of the diffraction grating 100 which laser light outputted from the mode-locked laser diode device 10 enters (runs into). Further, a plurality of apertures 111 for regulating entrance of laser light into the external resonator 110 are arranged between the diffraction grating 100 and the external resonator 110. The apertures 111 are specifically composed of a transmissive liquid crystal display unit 112 having many segments. Further, laser light (0-order diffracted light) outputted outside by the diffraction grating 100 is reflected by the reflecting mirror 102 according to needs, is collimated by the collimation lens 103 to become parallel beam, which is provided as laser output.

Wavelength of laser light outputted from the mode-locked laser diode device 10 has a certain wavelength range. Thus, primary diffracted light that is diffracted in the diffraction grating 100 may run into the external resonator 110 in many regions as illustrated in FIG. 4C depending on the wavelength of the laser light outputted from the mode-locked laser diode device 10. As illustrated in FIG. 4C, laser light is transmitted through a desired segment of the transmissive liquid crystal display unit 112 having many segments, and thereby only laser light having desired wavelength that is outputted from the mode-locked laser diode device 10 runs into the external resonator 110 composed of a concave mirror, is reflected by the external resonator 110, passes again through the desired segment of the transmissive liquid crystal display unit 112, runs into the diffraction grating 100, and is returned to the mode-locked laser diode device 10. Accordingly, by selecting the aperture 111, the wavelength of the laser light to be returned to the mode-locked laser diode device 10 is able to be controlled.

In the laser diode assembly of the second exemplified embodiment, the imaging section imaging the laser light outputted from the mode-locked laser diode device on the external resonator is included between the mode-locked laser diode device and the diffraction grating. That is, laser light that is outputted from the light output end face of the mode-locked laser diode device and enters (runs) into the diffraction grating is not parallel light beam. Thus, mode locking operation is able to be inhibited from being unstable. Further, area of the laser light that is outputted from the mode-locked laser diode device and runs into the diffraction grating is able to be widened more than in the first exemplified embodiment, diffraction efficiency is able to be improved, and wavelength selectivity is enlarged more than in the first exemplified embodiment. Further, a movable mechanism is not necessitated.

Third Exemplified Embodiment

Figure 5A:
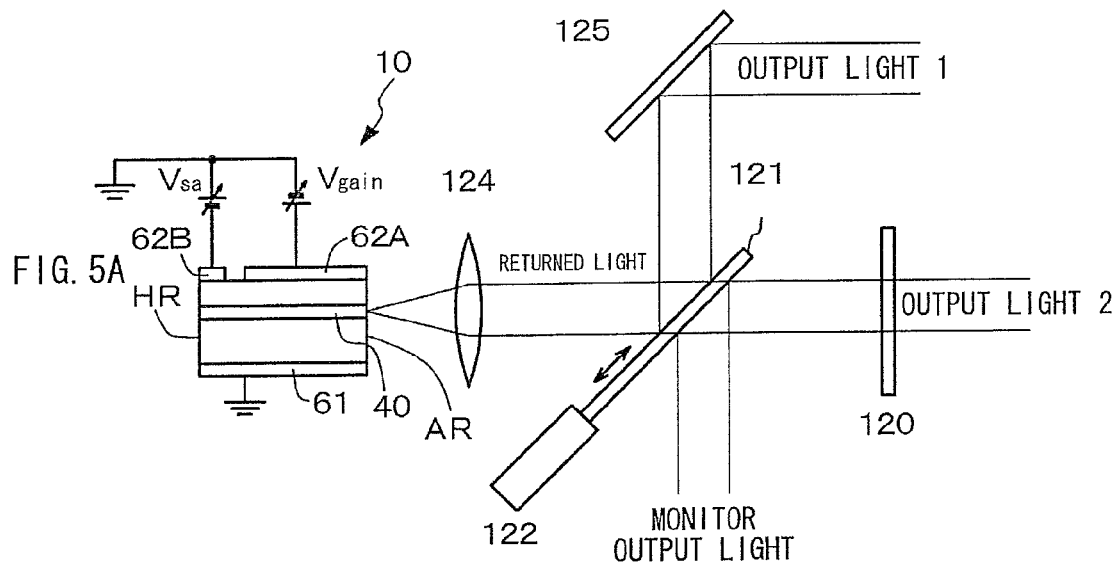
FIGS. 5A and 5B are conceptual views of a laser diode assembly of a third exemplified embodiment and a modification thereof.

The third exemplified embodiment relates to a laser diode assembly according to the third embodiment. FIG. 5A illustrates a conceptual view of the laser diode assembly of the third exemplified embodiment.

The laser diode assembly of the third exemplified embodiment includes (A) the mode-locked laser diode device 10, (B) an external resonator 120, (C) a bandpass filter 121 arranged between the mode-locked laser diode device 10 and the external resonator 120 and having a film thickness continuously changed, and (D) a moving unit 122 that moves the bandpass filter 121.

A Part of laser light running into the bandpass filter 121 is outputted outside as output light 1 (see FIG. 5A). In the example illustrated in FIG. 5A, the laser light (output light 1) outputted outside is reflected by a reflecting mirror 125, and is let out in a desired region. Meanwhile, the rest of the laser light running into the bandpass filter 121 passes through the bandpass filter 121, enters the external resonator 120, is reflected by the external resonator 120, passes through the bandpass filter 121, and is returned to the mode-locked laser diode device 10. It is to be noted that a part of the laser light that passes through the bandpass filter 121 and is returned to the mode-locked laser diode device 10 is reflected by the bandpass filter 121. Output direction of the laser light reflected by the bandpass filter 121 at this time is direction opposite to output direction of the output light 1. Such laser light reflected by the bandpass filter 121 is able to be used, for example, as a monitoring output light composed of a light detector. Incidentally, referential number 124 represents a lens for changing laser light outputted from the mode-locked laser diode device 10 into parallel light.

The bandpass filter 121 is able to be obtained, for example, by layering a dielectric thin film having low dielectric constant and a dielectric thin film having high dielectric constant, and a continuous change of the film thickness is able to be attained by, for example, forming a dielectric thin film based on oblique sputtering method or the like.

The moving unit 122 is formed with a piezoelectric device. The moving unit 122 moves the bandpass filter 121 in the direction of an arrow in FIG. 5A by displacement of the piezoelectric device generated by applying a voltage to the piezoelectric device. By moving the bandpass filter 121 as described above, laser light outputted from the mode-locked laser diode device 10 is able to hit into a region with different film thickness in the dielectric thin film laminated body. Thus, the wavelength of the output light 1 is able to be selected. That is, the bandpass filter 121 functions as a wavelength selection device, and also functions as an output coupler. It is to be noted that direction shift and position shift of the output light do not occur in association with wavelength selection.

In the existing technology, it has been found that if the bandpass filter is used as a wavelength selection device in the mode-locked laser diode device, unexpected light loss is given. The light loss is mainly caused by reflected light from the bandpass filter, and the reflected light is light returned to the mode-locked laser diode device. Meanwhile, in the third exemplified embodiment, reflected light from the bandpass filter as a wavelength selection device is extracted as the output light 1. Thereby, strong average light output, for example, strong average light output about 1.5 times to twice as much as that of the existing technology is able to be obtained.

It is to be noted that the external resonator 120 may be composed of a partial transmissive mirror (a half transmissive mirror or a half mirror) with reflectance of about 20%. Thereby, a part of laser light running into the external resonator 120 is able to be extracted outside (in FIG. 5A, the extracted light is indicated by output light 2). For example, in the case where a current flown to the first section 62A of the second electrode 62 is 110 milliampere and a reverse bias voltage applied to the first section 62A of the second electrode 62 is 13 volt, average light output in which light output of the output light 1 is 20 milliwatt and light output of the output light 2 is 10 milliwatt is able to be obtained.

Figure 5B:
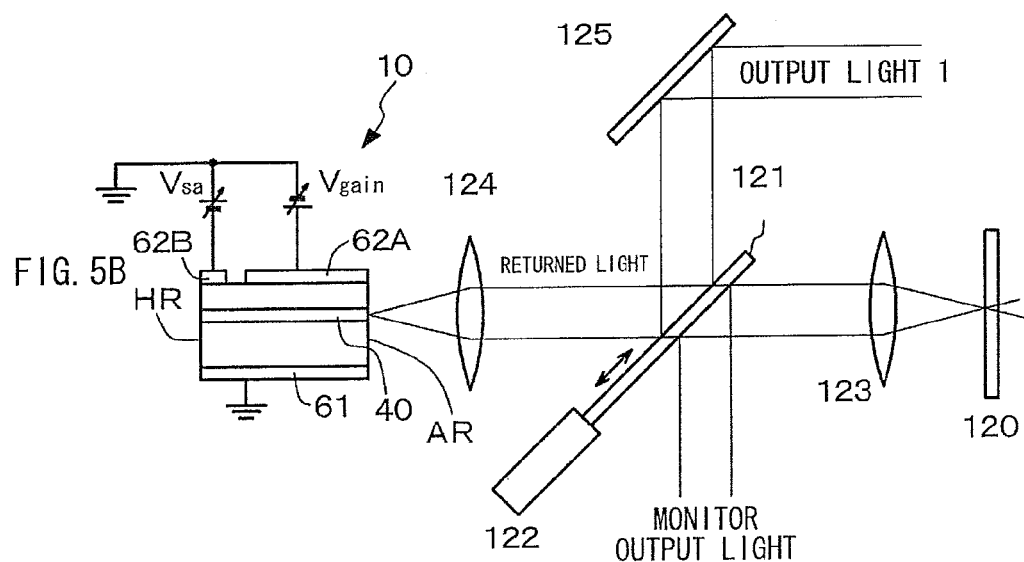

It is possible that an imaging section 123 composed of a lens having positive power, specifically a convex lens for imaging an image of the light output end face of the mode-locked laser diode device 10 on the external resonator is arranged between the mode-locked laser diode device 10 and the external resonator 120, specifically between the external resonator 120 and the bandpass filter 121 (refer to FIG. 5B). By arranging such an imaging section 123, mode locking operation is able to become more stable.

In the laser diode assembly of the third exemplified embodiment, a bandpass filter arranged between the mode-locked laser diode device and the diffraction grating and having a film thickness continuously changed and a moving unit that moves the bandpass filter are included. Thus, even if chirping amount is changed depending on drive conditions (injection current and reverse bias voltage) of the mode-locked laser diode device, location where laser light outputted from the light output end face of the mode-locked laser diode device runs into the bandpass filter is able to be changed. Thus, characteristics of the bandpass filter to the laser light outputted from the mode-locked laser diode device are able to be optimized, and large output is able to be obtained.

Fourth Exemplified Embodiment

The fourth exemplified embodiment is a modification of the mode-locked laser diode device described in the first exemplified embodiment, and relates to the third structure mode-locked laser diode device. In the first exemplified embodiment, the mode-locked laser diode device 10 is provided on the (0001) plane (C plane) of the n-type GaN substrate 21 as a crystal face having polarity. In the case where such a substrate is used, in some cases, saturable absorption is difficult to be controlled electrically due to QCSE effect (quantum confinement Stark effect) by internal electric field resulting from piezoelectric polarization and intrinsic polarization in the active layer 40. That is, it has been found that in some cases, it is necessary to increase a DC current value flown to the first electrode for obtaining self-pulsation operation and mode locking operation and reverse bias voltage value applied to the saturable absorption region, subpulse component associated with main pulse is generated, or synchronous is difficult to be obtained between an external signal and light pulse.

It has been found that the thickness of the well layer composing the active layer 40 is preferably optimized and the impurity doping concentration in the barrier layer composing the active layer 40 is preferably optimized for preventing occurrence of such phenomenon.

Specifically, the thickness of the well layer composing the GaInN quantum well active layer is desirably from 1 nm to 10.0 nm both inclusive, and is preferably from 1 nm to 8 nm both inclusive. By decreasing the thickness of the well layer, influence of piezoelectric polarization and intrinsic polarization is able to be decreased. Further, the impurity doping concentration of the barrier layer is desirably from $2*10^{18}$ cm$^{-3}$ to $1*10^{20}$ cm$^{-3}$ both inclusive, and is preferably from $1*10^{19}$ cm$^{-3}$ to $1*10^{20}$ cm$^{-3}$ both inclusive. Examples of impurity include silicon (Si) and oxygen (O). By setting the foregoing impurity doping concentration of the barrier layer as described above, carrier of the active layer is increased. As a result, influence of piezoelectric polarization and intrinsic polarization is able to be decreased.

In the fourth exemplified embodiment, the structure of the active layer 40 formed from the GaInN quantum well active layer composed of three barrier layers (composed of Ga$_{0.98}$In$_{0.02}$N) and two well layers (Ga$_{0.92}$In$_{0.08}$N) in the lamination structure illustrated in Table 2 is as follows. Further, in a mode-locked laser diode device of a fourth referential example, the structure of the active layer 40 in the lamination structure illustrated in Table 2 is as follows, specifically, the structure is the same as that of the first exemplified embodiment.

TABLE 2

|  | Fourth exemplified embodiment | Fourth referential example |
|---|---|---|
| Well layer | 8 nm | 10.5 nm |
| Barrier layer | 12 nm | 14 nm |
| Impurity doping concentration of well layer | Non-doped | Non-doped |
| Impurity doping concentration of barrier layer | Si: $2*10^{18}$ cm$^{-3}$ | Non-doped |

In the fourth exemplified embodiment, the thickness of the well layer is 8 nm, the barrier layer is doped with Si at a concentration of Si: $2*10^{18}$ cm$^{-3}$, and QCSE effect in the active layer is moderated. Meanwhile, in the fourth referential example, the thickness of the well layer is 10.5 nm, and the barrier layer is not doped with impurity.

Mode locking is determined by a DC current applied to the light emitting region and the reverse bias voltage $V_{sa}$ applied to the saturable absorption region as in the case of the first exemplified embodiment. Reverse bias voltage dependence of relation between an injection current and light output (L-I characteristics) of the fourth exemplified embodiment and the fourth referential example was measured. As a result, it is found that in the fourth referential example, as the reverse bias voltage $V_{sa}$ is increased, threshold current at which laser oscillation is started is gradually increased, and a change is shown at lower reverse bias voltage $V_{sa}$ compared to in the fourth exemplified embodiment. It indicates that in the active layer of the fourth exemplified embodiment, effect of saturable absorption is electrically controlled by the reverse bias voltage $V_{sa}$. However, in the fourth referential example, single mode (single basic lateral mode) self-pulsation operation and mode locking operation are confirmed in a state that reverse bias is applied to the saturable absorption region. Thus, it is needless to say that the fourth referential example is also included in the present disclosure.

Descriptions have been hereinbefore given of the present disclosure with reference to the preferred exemplified embodiments. However, the present disclosure is not limited to the foregoing exemplified embodiments. The compositions and the structures of the laser diode assembly and the mode-locked laser diode device described in the exemplified embodiments are just exemplified, and modifications may be made as appropriate. Further, in the exemplified embodiments, though various values have been shown, such various values are just exemplified as well, and thus it is needless to say that, for example, if specifications of the laser diode device to be used are changed, values are also changed.

Figure 6:
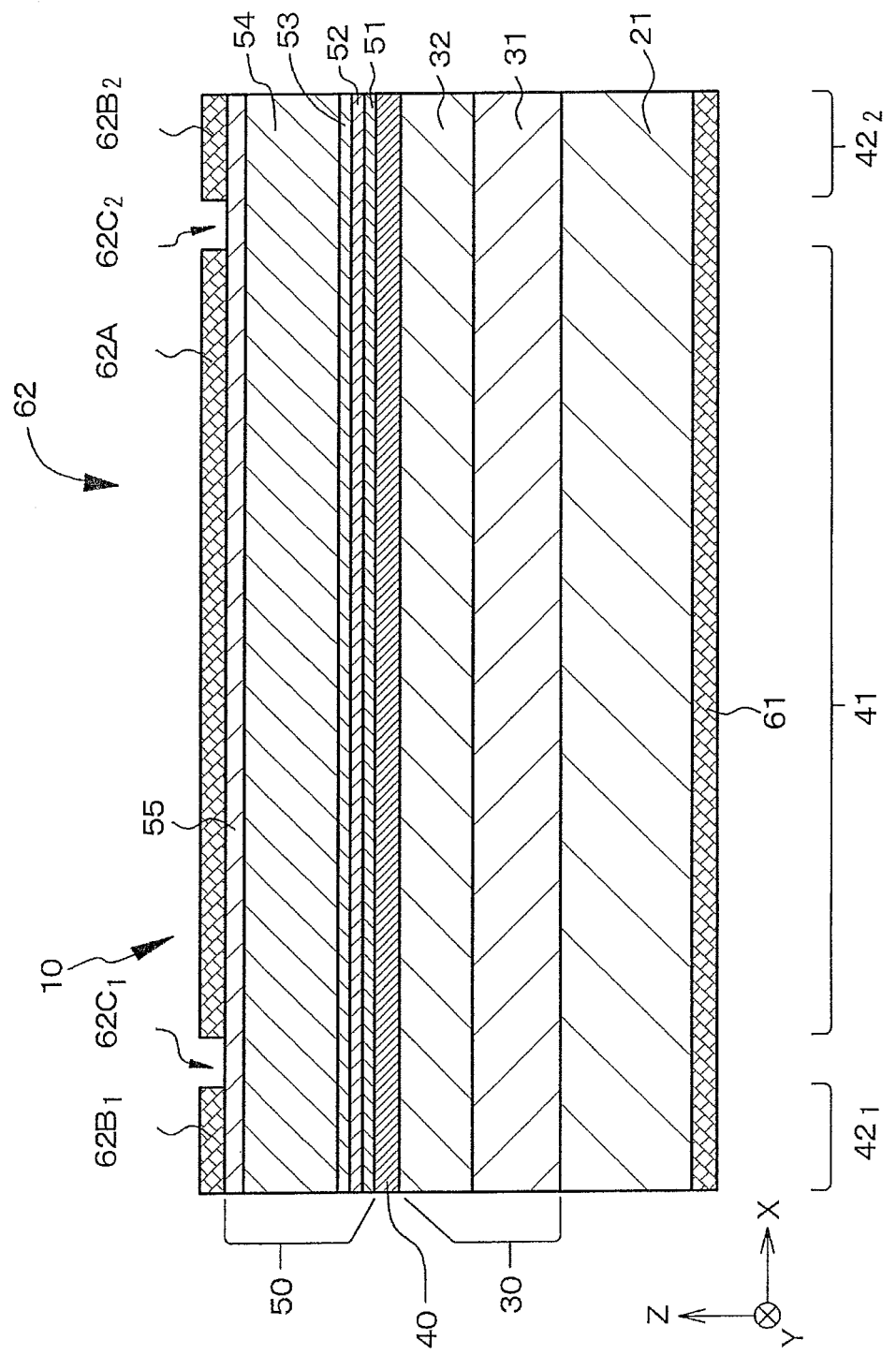
FIG. 6 is a schematic end face view along direction in which a resonator of a modification of the mode-locked laser diode device of the first exemplified embodiment extends.
Figure 7:
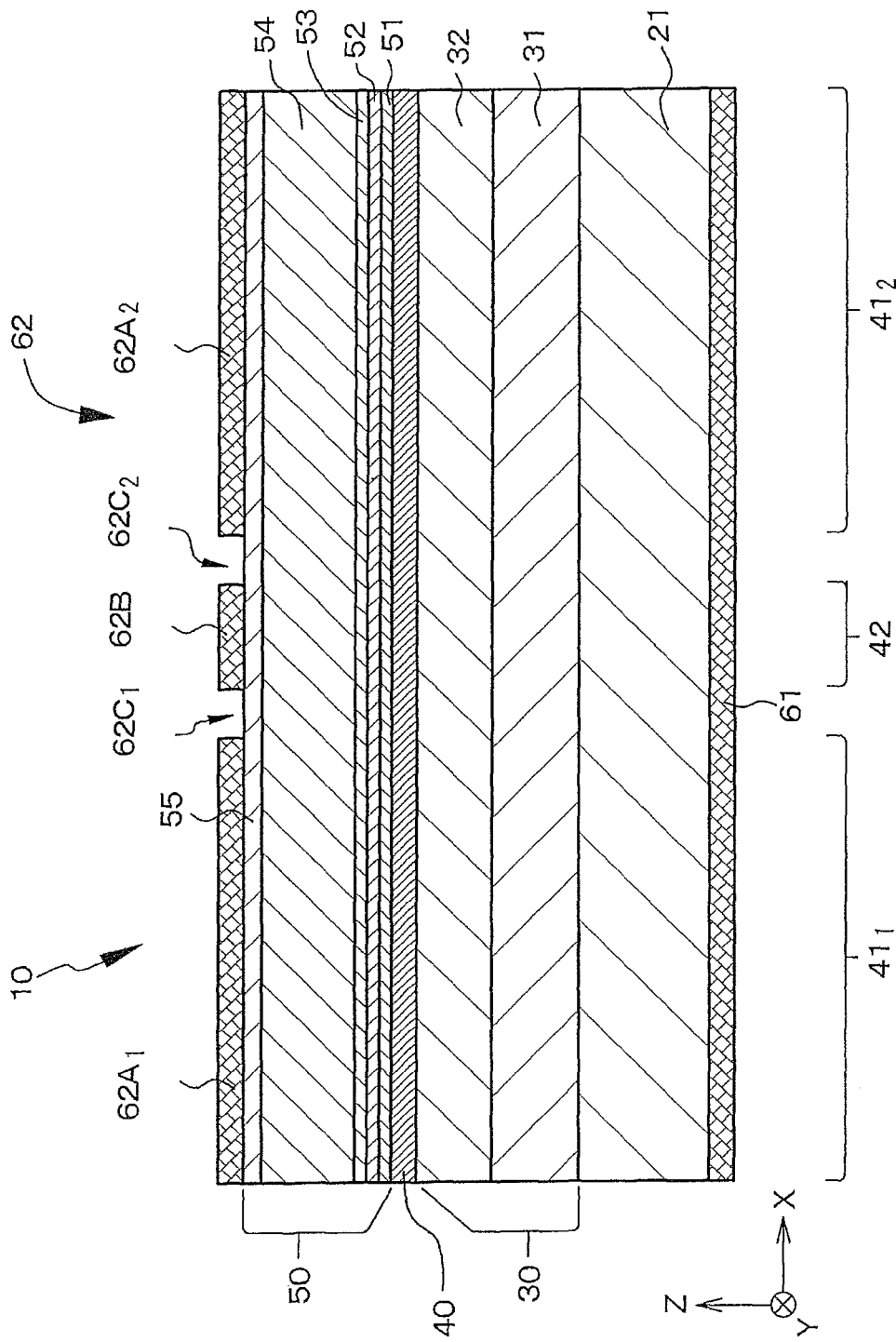
FIG. 7 is a schematic end face view along direction in which a resonator of another modification of the mode-locked laser diode device of the first exemplified embodiment extends.

The number of the light emitting regions 41 and the saturable absorption regions 42 is not limited to one. FIG. 6 illustrates a schematic end face view of a mode-locked laser diode device in which one first section 62A of the second electrode and two second sections 62B$_1$ and 62B$_2$ of the second electrode are provided. In the mode-locked laser diode device, one end of the first section 62A is opposed to one second section 62B$_1$ with one separation trench 62C$_1$ in between, and the other end of the first section 62A is opposed to the other second section 62B$_2$ with the other separation trench 62C$_2$ in between. Further, one light emitting region 41 is sandwiched between two saturable absorption regions 42$_1$ and 42$_2$. Further, FIG. 7 illustrates a schematic end face view of a mode-locked laser diode device in which two first sections 62A$_1$ and 62A$_2$ of the second electrode and one second section 62B of the second electrode are provided. In the mode-locked laser diode device, an end section of the second section 62B is opposed to one first section 62A$_1$ with one separation trench 62C$_1$ in between, and the other end of the second section 62B is opposed to the other first section 62A$_2$ with the other separation trench 62C$_2$ in between. Further, one saturable absorption region 42 is sandwiched between two light emitting regions 41$_1$ and 41$_2$.

Figure 8:
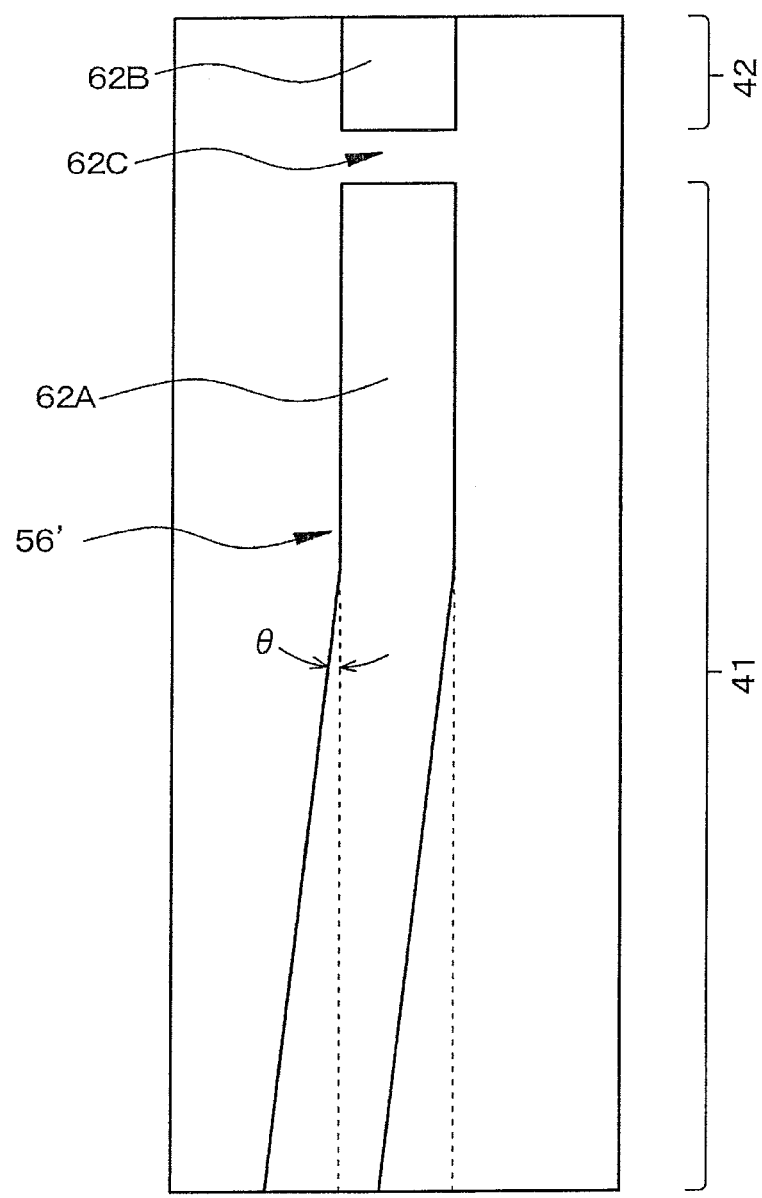
FIG. 8 illustrates a schematic view viewed from above of a ridge section in still another modification of the mode-locked laser diode device of the first exemplified embodiment.

The mode-locked laser diode device may be a laser diode device having an oblique ridge stripe type separate confinement heterostructure with oblique waveguide. FIG. 8 illustrates a schematic view viewed from above of a ridge section 56' in such a mode-locked laser diode device. The mode-locked laser diode device has a structure in which two straight line-like ridge sections are combined. A value of an angle θ at the intersection of the two ridge sections desirably satisfies, for example, 0<θ≤10 (deg), and preferably satisfies 0<θ≤6 (deg). By adopting the oblique ridge stripe type, reflectance of the end face provided with absent reflection coating is able to be closer to 0% as the ideal value. As a result, occurrence of laser light pulse that would revolve in the laser diode is able to be prevented, and the advantage that occurrence of sub laser light pulse associated with main laser light pulse is able to be inhibited is obtained.

In the exemplified embodiments, the mode-locked laser diode device 10 is provided on the {0001} plane, which is the C plane as the polarity plane of the n-type GaN substrate 21. Alternately, the mode-locked laser diode device 10 may be provided on A plane as an {11-20} plane, M plane as a {1-100} plane, non-polarity plane such as a {1-102} plane, an {11-2n} plane including an {11-24} plane and an {11-22} plane, or a semi-polarity plane such as a {10-11} plane and a {10-12} plane. Even if piezoelectric polarization and intrinsic polarization are thereby generated in the third compound semiconductor layer of the mode-locked laser diode device 10, piezoelectric polarization is not generated in the thickness direction of the third compound semiconductor layer and piezoelectric polarization is generated in the direction approximately perpendicular to the thickness direction of the third compound semiconductor layer. Thus, adverse effect resulting from piezoelectric polarization and intrinsic polarization is able to be excluded. It is to be noted that the {11-2n} plane section a non-polarity plane making 40 deg approximately with respect to the C plane. In the case where the mode-locked laser diode device 10 is provided on a non-polarity plane or on a semi-polarity plane, limitation of the thickness of the well layer (from 1 nm to 10 nm both inclusive) and limitation of the impurity doping concentration of the barrier layer (from $2*10^{18}$ cm$^{-3}$ to $1*10^{20}$ cm$^{-3}$ both inclusive) as described in the fourth exemplified embodiment are able to be eliminated.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A laser diode assembly comprising:
a mode-locked laser diode device;
a diffraction grating that outputs 0-order diffracted light outside;
an external resonator composed of a reflecting mirror that reflects primary or more order diffracted light from the diffraction grating and returns the reflected light to the mode-locked laser diode device thorough the diffraction grating;
an imaging section provided between the mode-locked laser diode device and the diffraction grating and imaging laser light outputted from the mode-locked laser diode device on the external resonator; and
a plurality of apertures provided between the diffraction grating and the external resonator and regulating entrance of laser light into the external resonator,
wherein the reflecting minor composing the external resonator is formed with a concave mirror, and
wherein curvature radius of the concave mirror is equal to distance from the diffraction grating to the concave mirror.

2. The laser diode assembly according to claim 1, wherein each of the apertures is composed of a transmissive liquid crystal display unit having many segments.

3. The laser diode assembly according to claim 1, wherein wavelength of laser light to be returned to the mode-locked laser diode device is controlled by selecting an aperture from the apertures.

\* \* \* \* \*